United States Patent [19]
Inaba et al.

[11] Patent Number: 5,793,788
[45] Date of Patent: Aug. 11, 1998

[54] SEMICONDUCTOR LIGHT EMITTING ELEMENT WITH P-TYPE NON-ALLOY ELECTRODE INCLUDING A PLATINUM LAYER AND METHOD FOR FABRICATING THE SAME

[75] Inventors: Yuichi Inaba; Kiyoshi Fujihara, both of Katano; Masato Ishino, Shijonawate; Takeshi Shimazaki, Kadoma; Isao Kidoguchi, Kawanishi, all of Japan

[73] Assignee: Matsushita Electric Industrial Co., Ltd., Osaka, Japan

[21] Appl. No.: 693,806

[22] Filed: Aug. 1, 1996

[30] Foreign Application Priority Data

Aug. 2, 1995 [JP] Japan .................................. 7-197329
Jan. 16, 1996 [JP] Japan .................................. 8-004549

[51] Int. Cl.$^6$ .............................. H01S 3/19; H01L 23/48; H01L 33/00
[52] U.S. Cl. .............................. 372/45; 372/46; 257/757; 257/766; 257/99; 257/768; 257/769
[58] Field of Search .................... 372/45, 46; 257/757, 257/768, 769, 99, 766, 763, 770, 753

[56] References Cited

U.S. PATENT DOCUMENTS

5,029,175 7/1991 Ohnaka et al. .......................... 372/45
5,511,088 4/1996 Loualiche et al. ....................... 372/46

OTHER PUBLICATIONS

Nakamura et al, "Candela–Class High–Brightness InGaN/AlGaN Double–Hetero Blue–Light–Emitting Diodes", Applied Physics Letters, vol. 64, No. 13., pp. 1687–1689, Mar. 1994.

Neamen, Semiconductor Physics and Devices: Basic Principles, Richard D. Irwin, Inc: Homewood, Il, (no month available) 1992, pp. 345–350.

A. Terano et al., The Extended Abstracts (The Spring Meeting, 1995 ): *The Japan Society of Applied Physics and Related Societies,* 31a–ZN–3, 1995; "Thermally Stable Ohmic Contacts using Pt for p–Type InGaAs" with partial English translation (no month).

M. Ishino et al., *The Proceedings of the 1990 Autumn National Convention of the Institute of Electronics, Information and Communication Engineers of Japan,* C–95, 1990; "1.3μm MQW–DFB laser fabricated by LPE" with partial English translation (no month).

K. Endo et al., The Extended Abstracts (The Autumn Meeting, 1981); *The Japan Society of Applied Physics and Related Societies,* 9A–K–4, 1981; "Relationship between Generation of <110>DLD and thickness of a 4–element cap layer in an InGaAsP/InP–DH laser" with partial English translation (no month available).

Primary Examiner—Rodney B. Bovernick
Assistant Examiner—Luong-Quyen T. Phan
Attorney, Agent, or Firm—Ratner & Prestia

[57] ABSTRACT

A semiconductor light emitting element includes a p-type electrode which in turn includes a contact electrode layer including at least a Pt layer. Particularly, the semiconductor light emitting element further includes a layered structure including at least an n-type cladding layer, an active layer, and a p-type cladding layer; and a p-type contact layer formed above the layered structure, and the contact electrode layer is formed on the p-type contact layer.

9 Claims, 16 Drawing Sheets

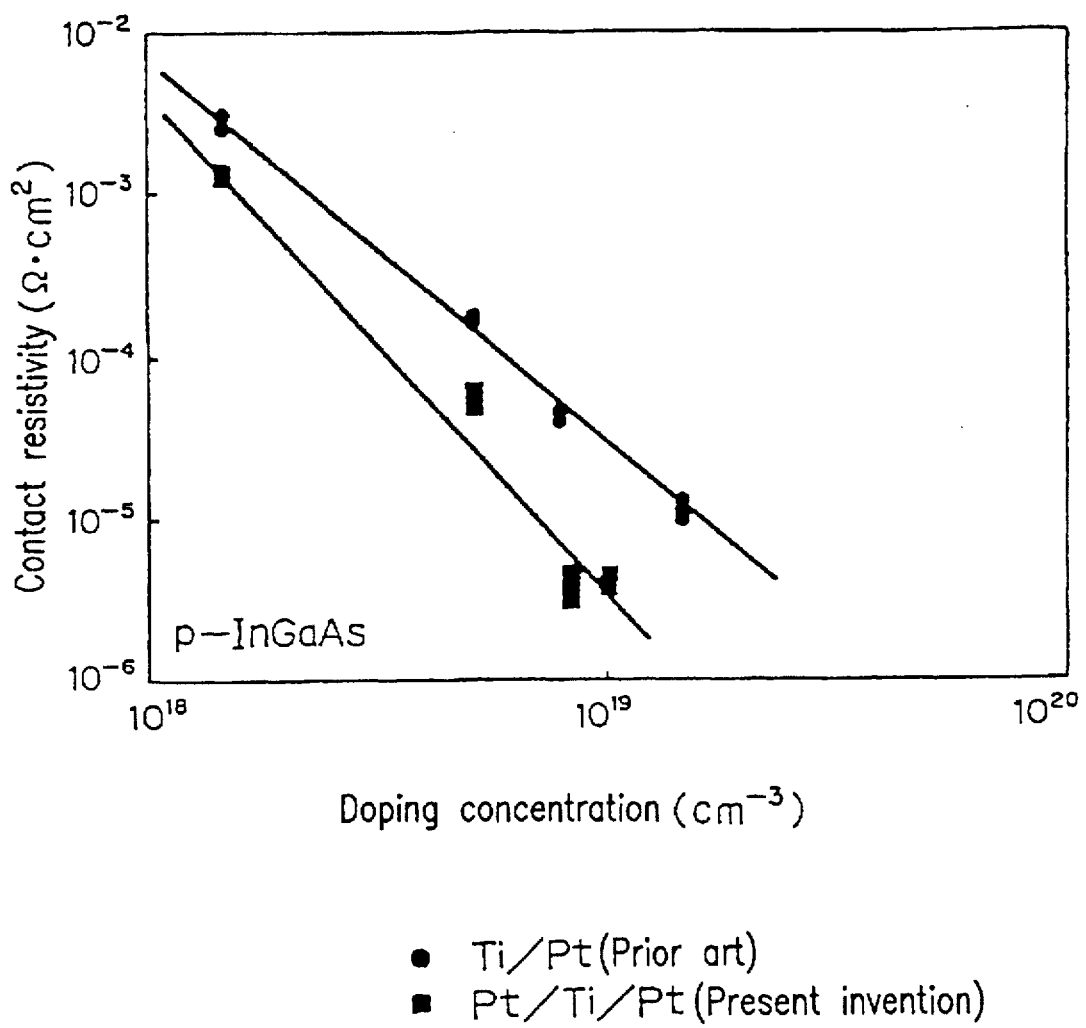

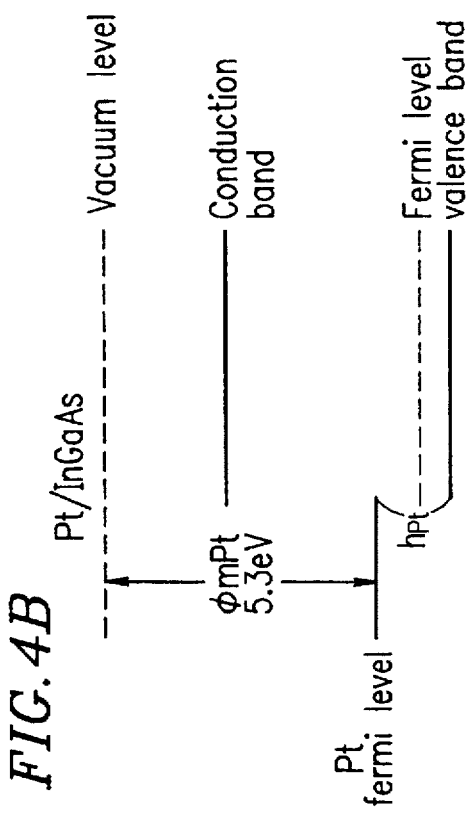
FIG.4A
φmTi (4.9eV) Ti work function
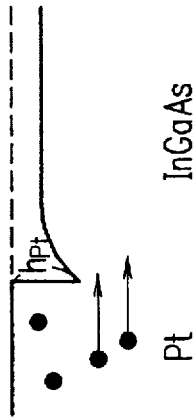
φmTi < φmPt
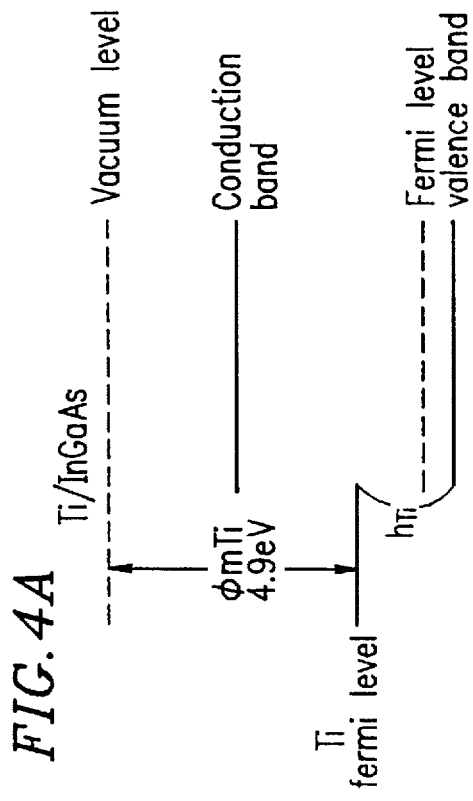
FIG.4B
φmPt(5.3eV) Pt work function
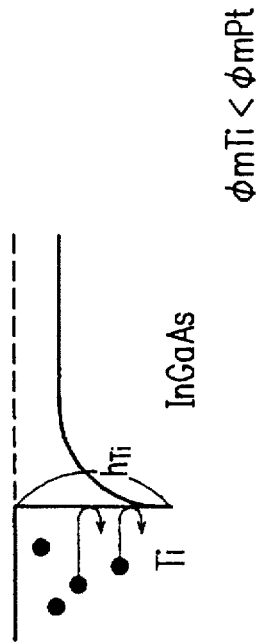
φmTi < φmPt

- ● Ti/Pt (Prior art)
- ■ Pt/Ti/Pt
- ▲ Pt

SEMICONDUCTOR LIGHT EMITTING ELEMENT WITH P-TYPE NON-ALLOY ELECTRODE INCLUDING A PLATINUM LAYER AND METHOD FOR FABRICATING THE SAME

BACKGROUND OF THE INVENTION

1. Field of the Invention:

The present invention relates to a semiconductor light emitting element and a method for fabricating the same. In particular, the present invention relates to a semiconductor light emitting element such as a semiconductor laser including an electrode structure having low resistance and high reliability, and a method for fabricating the same.

2. Description of the Related Art:

FIG. 9A is a diagram showing one example of a structure of a conventional InP-type semiconductor laser (see "The Proceedings of 1990 Autumn National Convention of the Institute of Electronics", Information and Communication Engineers of Japan, C-95, by Ishino et al.).

A semiconductor laser 900 is formed in the following manner: an n-InP cladding layer 902, an InGaAs active layer 903, and a p-InP cladding layer 904 are sequentially grown on an n-InP substrate 901. Then, an etching is performed thereon so as to form a mesa-stripe 920. After that, a P-InP current blocking layer 905 and an n-InP current blocking layer 906 are grown on both sides of the mesa-stripe 920 by a liquid phase epitaxial growth method or a by vapor-phase epitaxial growth method. Furthermore, on the mesa-stripe 920, the p-type current blocking layer 905 and the n-type current blocking layer 906, a p-InP burying layer 907 and a p-InGaAsP contact layer 908 are grown, so that an burying-type hetero structure is formed.

Next, a p-type electrode 909 is formed on the p-type contact layer 908, and then a metallic multilayered film 910 is deposited on the entire surface of the p-type electrode 909. Finally, an n-type electrode 911 is formed on the backside of the n-InP substrate 901. In this manner, the semiconductor laser 900 is completed.

In operation, the semiconductor laser 900 fabricated in the above-described process is attached to a heatsink 912 via a soldering material 913 in a junction-down direction as shown in FIG. 9B, in order to enhance the heat radiation characteristics thereof.

One of the main factors determining the heat radiation characteristics of the semiconductor laser is the structure of the p-type electrode. In general, an alloy electrode or a non-alloy electrode is used as a p-type electrode. The alloy electrode includes a layer made of the alloy of Au and Zn for obtaining ohmic contact with a contact layer (hereinafter, this layer is referred to as "a contact electrode layer"). The non-alloy electrode includes a contact electrode layer obtained by sequentially forming a Ti layer and a Pt layer on the contact layer. Use of a non-alloy electrode allows the thickness of the contact layer having poor heat conductivity to be smaller as compared with the case of using the alloy electrode, thereby obtaining benefits such as enhanced heat radiation characteristics of the element.

Moreover, it is reported at "The Extended Abstracts" (The Spring Meeting, 1995); The Japan Society of Applied Physics and Related Societies, 31a-ZN-3, by Terano et al., that in the field of electronics devices, specifically, hetero-junction bipolar transistors (HBTs), a low-resistance ohmic contact can be attained by performing the doping for a p-InGaAs contact layer so as to have a high concentration of $4 \times 10^{19} cm^{-3}$ and also providing a Pt layer between the contact layer and the Ti layer.

When a p-type electrode includes a contact electrode layer of a Ti/Pt structure obtained by sequentially depositing a Ti layer and a Pt layer on a p-type contact layer, whereby an ohmic contact can be attained, a sufficiently low contact resistance cannot be obtained. Because of this, when a semiconductor laser including a contact layer with the Ti/Pt structure is driven by a high bias current, a large amount of Joule heat is generated so that the temperature inside the laser element is increased, resulting in significant saturation of the laser light output. Accordingly, the semiconductor laser driven by a high bias current is required to have further decreased contact resistance.

In one of the methods for solving the above problem, a doping concentration of the contact layer is increased. In fact, in the field of electronics devices such as HBTs, the above-mentioned method can be employed for solving this problem. However, in the field of the semiconductor light emitting elements such as semiconductor lasers, when the doping concentration of the contact layer is increased as described above, there arises the problem that the lifetime of the semiconductor laser may be shortened due to the diffusion of the dopant into the active layer.

SUMMARY OF THE INVENTION

The semiconductor light emitting element of this invention includes a p-type electrode which includes a contact electrode layer, wherein the contact electrode layer includes at least a Pt layer.

In one embodiment of the invention, a semiconductor light emitting element further includes: a layered structure including at least an n-type cladding layer, an active layer, and a p-type cladding layer; and a p-type contact layer formed above the layered structure, wherein the contact electrode layer is formed on the p-type contact layer.

In another embodiment of the invention, a semiconductor light emitting element further includes: a mesa-stripe formed on a substrate including the layered structure; a current blocking layer formed on both sides of the mesa-stripe; and a p-type burying layer formed on both the mesa-stripe and the current blocking layer so as to have a buried structure, wherein the p-type contact layer is formed on the p-type burying layer.

In still another embodiment of the invention, the n-type cladding layer and the active layer included in the layered structure are formed on a substrate, and the p-type cladding layer and the p-type contact layer are included in a ridge layer formed on the active layer so as to form a ridge-shaped structure.

In still another embodiment of the invention, the p-type contact layer is made of p-type InGaAs, and the doping concentration of the p-type contact layer is set within the range between about $5 \times 10^{18} cm^{-3}$ and about $1 \times 10^{19} cm^{-3}$.

In still another embodiment of the invention, the p-type contact layer is made of p-type InGaAs, and the p-type contact layer has a thickness larger than a thickness of a depletion layer formed by a metal-semiconductor contact between the p-type contact electrode layer and the p-type contact layer.

In still another embodiment of the invention, the Pt layer is brought into contact with the p-type contact electrode layer.

In still another embodiment of the invention, the contact electrode layer further comprises a Ti layer deposited on the Pt layer.

In still another embodiment of the invention, the contact electrode layer further comprises a Ti layer deposited on the Pt layer and another Pt layer deposited on the Ti layer.

In the present invention, a semiconductor light emitting element includes: a p-type contact layer; and a p-type electrode formed on the p-type contact layer, the p-type contact layer including a contact electrode layer, wherein the contact electrode layer includes at least a metallic layer made of a metal having an excellent adhesiveness to a semiconductor material and an insulating film, and a Pt layer formed on the metallic layer.

In one embodiment of the invention, the metallic layer is an Ni layer.

In another embodiment of the invention, the contact electrode layer further comprises a Ti layer deposited on the Pt layer.

In still another embodiment of the invention, the contact electrode layer further comprises a Ti layer deposited on the Pt layer and another Pt layer deposited on the Ti layer.

In the present invention, a semiconductor light emitting element includes: a p-type contact layer; and a p-type electrode formed on the p-type contact layer, the p-type contact layer including a contact electrode layer, wherein the contact electrode layer includes at least a Pt layer.

In one embodiment of the invention, the p-type contact layer is made of GaAs.

In another embodiment of the invention, the p-type contact layer is made of GaInP.

In still another embodiment of the invention, the p-type contact layer is made of GaN.

In still another embodiment of the invention, the p-type contact layer is made of AlGaInN.

In still another embodiment of the invention, the Pt layer is brought into contact with the P-type contact electrode layer.

In still another embodiment of the invention, the contact electrode layer further comprises a Ti layer deposited on the Pt layer.

In still another embodiment of the invention, the contact electrode layer further comprises a Ti layer deposited on the Pt layer and another Pt layer deposited on the Ti layer.

In the present invention, a semiconductor light emitting element includes: an active layer; a first AlGaInP first cladding layer of a first conductive type formed on the active layer into a stripe-shape; a second AlGaInP cladding layer of a second conductive type formed below the active layer; a current blocking layer formed on both sides of the stripe-shaped first cladding layer; a contact layer formed on the first cladding layer and the current blocking layer; and an electrode formed on the contact layer, the contact layer including a contact electrode layer, wherein the contact electrode layer includes at least a Pt layer.

In one embodiment of the invention, the Pt layer is brought into contact with the p-type contact electrode layer.

In another embodiment of the invention, the contact electrode layer further comprises a Ti layer deposited on the Pt layer.

In still another embodiment of the invention, the contact electrode layer further comprises a Ti layer deposited on the Pt layer and the other Pt layer deposited on the Ti layer.

In the present invention, a semiconductor light emitting element includes: a substrate; a buffer layer formed on the substrate; an AlGaInN active layer formed above the buffer layer; upper and lower AlGaInN cladding layers formed so as to sandwich the active layer, the upper and lower AlGaInN cladding layers having a band gap energy larger than the band gap energy of the active layer; a contact layer formed on the upper cladding layer and made of III–V group compound semiconductor containing nitrogen as a V group element; and an electrode formed on the contact layer, the contact layer including a contact electrode layer, wherein the contact electrode layer includes at least a Pt layer.

In one embodiment of the invention, the Pt layer is brought into contact with the p-type contact electrode layer.

In another embodiment of the invention, the contact electrode layer further comprises a Ti layer deposited on the Pt layer.

In still another embodiment of the invention, the contact electrode layer further comprises a Ti layer deposited on the Pt layer and the other Pt layer deposited on the Ti layer.

In the present invention, a method for fabricating a semiconductor light emitting element includes the steps of: forming a layered structure made of semiconductor material on a substrate; forming a p-type contact layer above the layered structure; applying a resist onto the p-type contact layer; removing the resist from only a first region of the p-type contact layer; forming a contact electrode layer including at least a Pt layer being into contact with the p-type contact layer on the resist and the p-type contact layer of the first region; and removing the contact electrode layer and the resist from regions other than the first region by lift-off, so as to form a p-type electrode including the contact electrode layer in the first region.

In one embodiment of the invention, a method for fabricating a semiconductor light emitting element further includes the steps of: forming a mesa-stripe structure in the layered structure; forming a current blocking layer on both sides of the mesa-stripe; and forming a p-type burying layer on the current blocking layer, wherein the p-type contact layer is formed on the p-type burying layer.

In another embodiment of the invention, a method for fabricating a semiconductor light emitting element further includes the steps of: forming a mask by an insulating film on the p-type contact layer; and forming a ridge including the p-type cladding layer and the p-type contact layer by using the mask.

In still another embodiment of the invention, a method for fabricating a semiconductor light emitting element further includes the step of forming a Ti layer on the Pt layer.

In still another embodiment of the invention, a method for fabricating a semiconductor light emitting element further includes the steps of: forming a Ti layer on the Pt layer; and forming another Pt layer on the Ti layer.

Thus, the invention described herein makes possible the advantages of (1) providing semiconductor light emitting elements such as semiconductor lasers which have an electrode structure capable of realizing a low-resistance ohmic contact while suppressing the doping concentration of the contact layer to the level at which the lifetime of the elements is not shortened; and (2) a method for fabricating the same.

These and other advantages of the present invention will become apparent to those skilled in the art upon reading and understanding the following detailed description with reference to the accompanying figures.

BRIEF DESCRIPTION OF THE DRAWINGS

FIG. 3 is a graph illustrating a doping concentration dependency of the contact resistivity according to Example 1 of the present invention.

FIGS. 4A and 4B are diagrams schematically illustrating the changes of the band diagram accompanying the contact between the metal (Ti or Pt) and the semiconductor (InGaAs).

DESCRIPTION OF THE PREFERRED EMBODIMENTS

Hereinafter, the present invention will be described by way of illustrative examples with reference to the accompanying drawings.

(EXAMPLE 1)

FIGS. 1A to 1D are cross-sectional views showing a semiconductor light emitting element according to Example 1 of the present invention. Specifically, FIGS. 1A to 1D are cross-sectional views showing a structure of a semiconductor laser 100 having a buried structure, and the steps of fabricating the same.

Figure 1A:
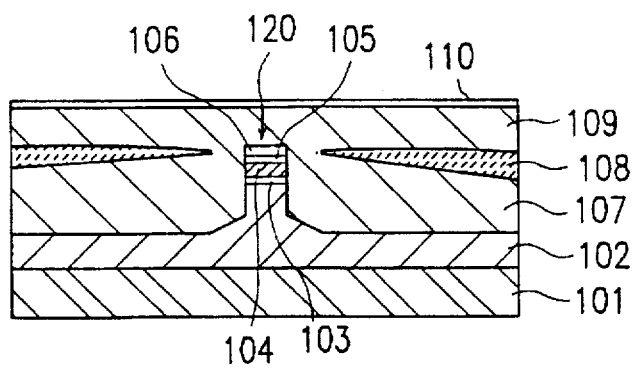
FIGS. 1A to 1D are cross-sectional views showing a structure of a semiconductor laser which is a semiconductor light emitting element according to Example 1 of the present invention and the steps of fabricating the same.

The semiconductor laser 100 is fabricated in the following manner: first, as shown in FIG. 1A, an n-InP cladding layer 102 having a thickness of about 5 μm, an n-InGaAsP optical waveguide layer 103 having a thickness of about 500 nm, a multi-quantum well active layer 104 including 5 pairs of an InGaAsP well layer having a thickness of about 5 nm and an InGaAsP barrier layer having a thickness of about 10 nm, a p-InGaAsP optical waveguide layer 105 having a thickness of about 500 nm, and a p-InP cladding layer 106 having a thickness of about 0.5 μm, are sequentially grown on an n-InP substrate 101 by epitaxy, so as to form a semiconductor layered structure. Next, the thus-obtained structure is subjected to photolithography and etching so as to form a mesa-stripe 120 having a width of about 2 μm. After that, on both sides of the mesa-stripe 120, a p-InP current blocking layer 107 and an n-InP current blocking layer 108 are grown by a liquid-phase epitaxial growth method. Furthermore, on the mesa-stripe 120, the p-type current blocking layer 107 and the n-type current blocking layer 108, a p-InP burying layer 109 and a p-InGaAs contact layer 110 having a thickness of about 0.2 μm are sequentially grown. As a result, a buried-type hetero structure is formed.

Figure 1B:
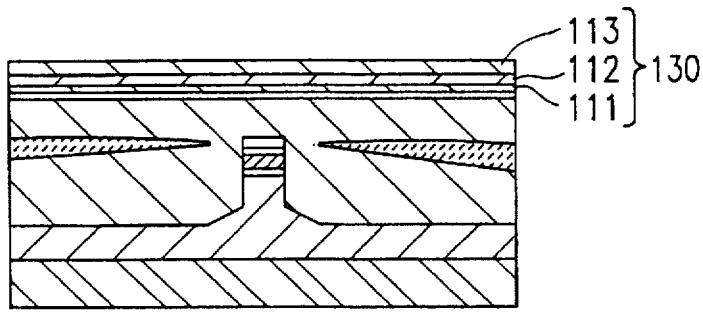

Next, as shown in FIG. 1B, on the p-InGaAs contact layer 110, a Pt layer 111 having a thickness of about 10 nm, a Ti layer 112 having a thickness of about 50 nm, and another Pt layer 113 having a thickness of about 50 nm are sequentially deposited so as to form a metallic multilayered film. After that, the thus-obtained metallic multilayered film is subjected to annealing, so that a contact electrode layer 130 (thickness: about 110 nm) included in a p-type electrode is formed.

Figure 1C:
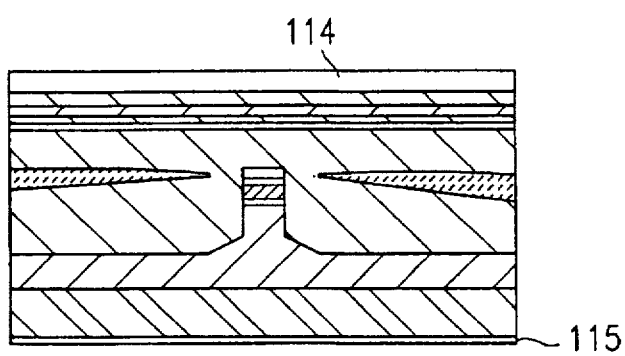

Then, as shown in FIG. 1C, a metallic multilayered film 114 including a Ti layer, a Pt layer, and an Au layer is deposited on the entire surface of the Pt layer 113, which is the top layer of the contact electrode layer 130. Finally, an n-type electrode 115 including an Au layer, an Sn layer, a Cr layer, a Pt layer, and an Au layer is formed on the backside of the n-InP substrate 101. In this manner, the semiconductor laser 100 is completed.

Figure 1D:
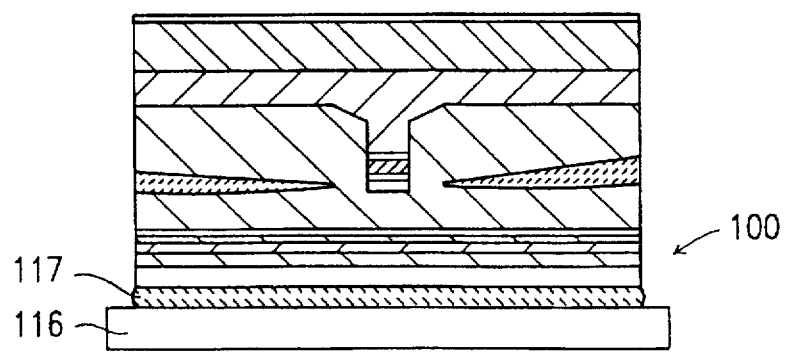

In operation, the semiconductor laser 100 fabricated in the above-mentioned process is attached to a heat sink 116 via a soldering material 117 in a junction-down direction, in order to enhance the heat radiation characteristics thereof, as shown in FIG. 1D.

The Ti layer included in the metallic multilayered film 114 is used due to its excellent adhesiveness to the Pt layer included in the contact electrode layer 130. Alternatively, other metallic layers can be used instead of the Ti layer if a sufficient adhesiveness can be obtained. For example, a Cr layer can be used instead of the Ti layer. On the other hand, the Pt layer is included in the metallic multilayered film 114 in order to prevent the metal contained in the soldering material 117 from entering the semiconductor layers constituting the semiconductor laser 100 when the semiconductor laser 100 is bonded to the heat sink 116. Accordingly, as far as this objective is satisfied, other kinds of metals or other thicknesses of the layer to be formed can be employed. Moreover, as far as the entry of the soldering material 117 can be prevented, the Pt layer can be omitted from the metallic multilayered film 114.

In the semiconductor laser 100 having the above-described structure, the doping concentration of the P-InGaAs contact layer 110 is typically about $8 \times 10^{18} cm^{-3}$. If a semiconductor laser includes a contact layer having a doping concentration of larger than about $1 \times 10^{19} cm^{-3}$, there is a fear that long-term reliability may be adversely affected due to the problem of carrier diffusion, and the like. On the other hand, if a semiconductor laser includes a contact layer having a doping concentration of less than about $5 \times 10^{18} cm^{-3}$, it becomes difficult to obtain an ohmic contact having a sufficiently low contact resistance. Accordingly, it is preferable that the p-InGaAs contact layer 110 has a doping concentration in the range between about $5 \times 10^{18} cm^{-3}$ and about $1 \times 10^{19} cm^{-3}$.

Figure 2:
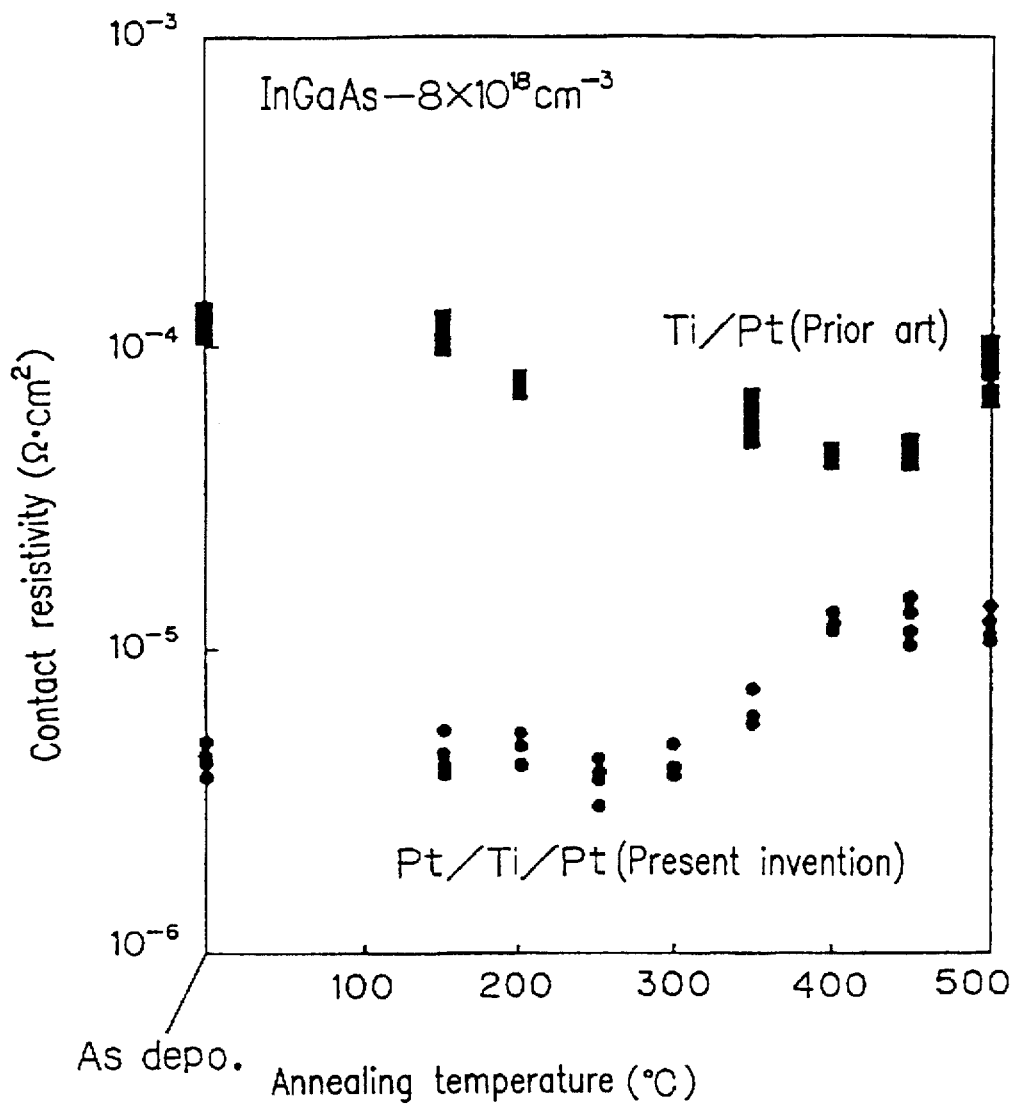
FIG. 2 is a graph illustrating an annealing temperature dependency of the contact resistivity according to Example 1 of the present invention.

FIG. 2 is a graph illustrating the relationship between a contact resistivity of a contact electrode layer and an annealing temperature for forming the contact electrode layer according to an experiment conducted by the present inventors, by using a p-InGaAs contact layer having a doping concentration of about $8 \times 10^{18} cm^{-3}$.

As seen in FIG. 2, a Ti/Pt contact electrode layer according to the conventional technique exhibits a contact resistivity of about $1 \times 10^{-4}$ $\Omega \cdot cm^2$ at an annealing temperature of about 500° C. or less. In contrast, a Pt/Ti/Pt contact electrode layer used in the semiconductor laser 100 of the present example exhibits a contact resistivity of about $1 \times 10^{-5} \Omega \cdot cm^2$ or less. This value is one order of magnitude smaller than that obtained from the conventional Ti/Pt contact electrode layer.

FIG. 3 is a graph illustrating the relationship between the contact resistivity of the contact electrode layer and a doping concentration of a p-InGaAs contact layer, according to the experiment conducted by the present inventors.

It is preferable that the contact resistivity of the semiconductor laser is about $1 \times 10^{-5}$ $\Omega \cdot cm^2$ or less. In this case, when a conventional Ti/Pt contact electrode layer is used, the p-InGaAs contact layer is required to have a doping concentration of about $1 \times 10^{19} cm^{-3}$ or more. In contrast, in order to obtain the above-mentioned value of contact resistivity with the Pt/Ti/Pt contact electrode used in the semiconductor laser 100 of this example, it is sufficient that the p-InGaAs contact layer has a doping concentration of about $7 \times 10^{18} cm^{-3}$.

Consequently, it is confirmed that the Pt/Ti/Pt contact electrode layer used in the semiconductor laser 100 of this example is sufficiently useful as a part of a p-type non-alloy electrode of the semiconductor laser.

As shown in FIGS. 2 and 3, the contact resistivity of the Pt/Ti/Pt contact layer of this example is lower than that of the conventional Ti/Pt contact electrode layer. Hereinafter, the reason thereof will be briefly described with reference to FIGS. 4A and 4B. FIG. 4A is a diagram schematically showing a change of band diagram in the case where Ti and InGaAs are brought into contact with each other. The upper portion of FIG. 4A shows band diagram before Ti and InGaAs are brought into contact with each other, and the lower portion thereof shows a band diagram after Ti and InGaAs are brought into contact with each other. Similarly, FIG. 4B is a diagram schematically showing a change of band diagram in the case where Pt and InGaAs are brought into contact with each other. The upper portion of FIG. 4B shows a band diagram before Pt and InGaAs are brought into contact with each other, and the lower portion thereof shows a band diagram after Pt and InGaAs are brought into contact with each other. Furthermore, the work function $\phi_m Ti$ of Ti is 4.9 eV, and the work function $\phi_m Pt$ of Pt is 5.3 eV.

As shown in FIGS. 4A and 4B, when Ti or Pt and InGaAs are brought into contact with each other, the band positions of Ti or Pt and InGaAs are adjusted so that the fermi level of Ti or Pt and the fermi level of InGaAs are at the same level with each other. As a result, after Ti or Pt and InGaAs are brought into contact with each other, an energy barrier having a height $h_{Ti}$ or $h_{Pt}$, equal to the difference between the fermi level of Ti or Pt and that of InGaAs before they are brought into contact with each other, is formed at the interface between Ti or Pt and InGaAs. In this case, the work function $\phi_m Pt$ of Pt is larger than the work function $\phi_m Ti$ of Ti. Because of this, the height $h_{Pt}$ of the energy barrier formed at the interface between Pt and InGaAs is smaller than the height $h_{Ti}$ of the energy barrier formed at the interface between Ti and InGaAs. As a result, the carrier injected into Pt can move toward InGaAs more easily as compared with the case of Ti. Therefore, the conductivity from Pt toward InGaAs becomes larger than that from Ti toward InGaAs.

For the above-mentioned reasons, it becomes easier to obtain an ohmic contact in the Pt/Ti/Pt contact electrode layer of this example as compared with the case of using the conventional Ti/Pt contact electrode layer. Accordingly, a low-resistance ohmic contact can be obtained between the p-type contact layer and the contact electrode layer of the p-type electrode without increasing a doping concentration of the p-type contact layer. As a result, it is possible to decrease the voltage for driving the semiconductor laser, thereby decreasing the power consumption. Moreover, upon decreasing the contact resistance, the lower doping concentration of the p-type contact layer is achieved as compared with the case of using the conventional Ti/Pt contact electrode layer. This makes it possible to prevent the dopant inside the contact layer from diffusing into the active layer, thereby enhancing the reliability of the semiconductor laser.

Conventionally, when an alloy electrode is used, the contact layer is required to have a thickness of about 1 μm. The reason thereof is as follows: when an alloy electrode is used, a heat treatment such as an annealing produces a reaction layer (thickness: about 0.5 μm) between the an alloy electrode of Au and Zn and a contact layer. Thus, if the contact layer has a thickness smaller than that of the reaction layer, the reliability of the laser is adversely affected as described in Extended Abstracts (The Autumn meeting, 1981); The Japan Society of Applied Physics and Related Societies, 9a-k-4, by Endo et al. In contrast, when the Pt/Ti/Pt contact electrode layer of the present example is used, a heat treatment such as annealing produces only a small reaction layer between the electrode and the contact layer. This allows the thickness of the contact layer to be smaller than about 1 μm. Thus, the heat radiation characteristics of the semiconductor laser can be improved. Specifically, use of the Pt/Ti/Pt contact electrode layer of this example allows the contact layer to have a thickness as small as that of a depletion layer formed by the metal-semiconductor contact between the contact electrode layer and the contact layer.

However, when the contact layer has a thickness smaller than that of the depletion layer, there are some cases where the contact resistivity is increased. This is because the thickness of the contact layer is too small. If the thickness of the contact layer is too small, even when the contact layer and the Pt/Ti/Pt contact electrode layer are brought into contact with each other, it is required to take into consideration the contact between the p-type cladding layer located under the contact layer and the Pt/Ti/Pt contact electrode layer, from the viewpoint of the band diagram. In this case, since the band gap of the p-type cladding layer is larger than that of the contact layer, a further larger energy barrier is generated at the interface with the Pt/Ti/Pt contact electrode layer. For this reason, when the contact layer has a thickness smaller than that of the depletion layer, there are some cases where the contact resistivity is increased.

Hereinafter, the results of the experiment in the reliability of the contact electrode layer having a Pt/Ti/Pt structure of this example and the contact electrode layer having a conventional Ti/Pt structure, which has been conducted by the present inventors, will be described with reference to FIG. 16.

In the experiment, two kinds of samples, a sample A and a sample B, are used as the evaluation samples. Sample A, having a conventional structure, is obtained in the following manner: first, a p-InGaAs layer having a doping concentration of about $7.8 \times 10^{18} cm^{-3}$ is formed on a substrate. Next, a Ti layer and a Pt layer are sequentially deposited thereon. Then, annealing is performed thereto for about 30 seconds at the temperature of about 400° C. As a result, a contact electrode layer is completed. On the other hand, sample B, having a structure of this example of the present invention, is obtained in the following manner: first, a p-InGaAs layer having a doping concentration of about $8.4 \times 10^{18} cm^{-3}$ is formed on a substrate. Next, a Pt layer, Ti layer, and Pt layer are sequentially deposited thereon. Then, annealing is performed thereto for about 30 seconds at a temperature of about 200° C. As a result, a contact layer is completed. Whereas the resultant sample A has a contact resistivity $\rho_c$ of about $4.5 \times 10^{-5} \Omega \cdot cm^2$, the resultant sample B has a contact resistivity $\rho_c$ of about $4.0 \times 10^{-6} \Omega \cdot cm^2$, which is about one order of magnitude smaller than the contact resistivity of the sample A.

The thus-obtained samples A and B are disposed in a nitrogen gas atmosphere, and the change in the contact resistivity with time is measured while setting the ambient temperature at three different values of about 300° C., about 350° C., and about 400° C. The period of time which is required for the contact resistivity $\rho_c$ to increase to reach $1 \times 10^{-4} \Omega \cdot cm^2$ is measured, and the measured period of time is defined as a deterioration time which indicates an estimated lifetime. Under these conditions, the comparison is conducted. The measurement is conducted by a Transmission Line Model (TLM) method.

Figure 16:
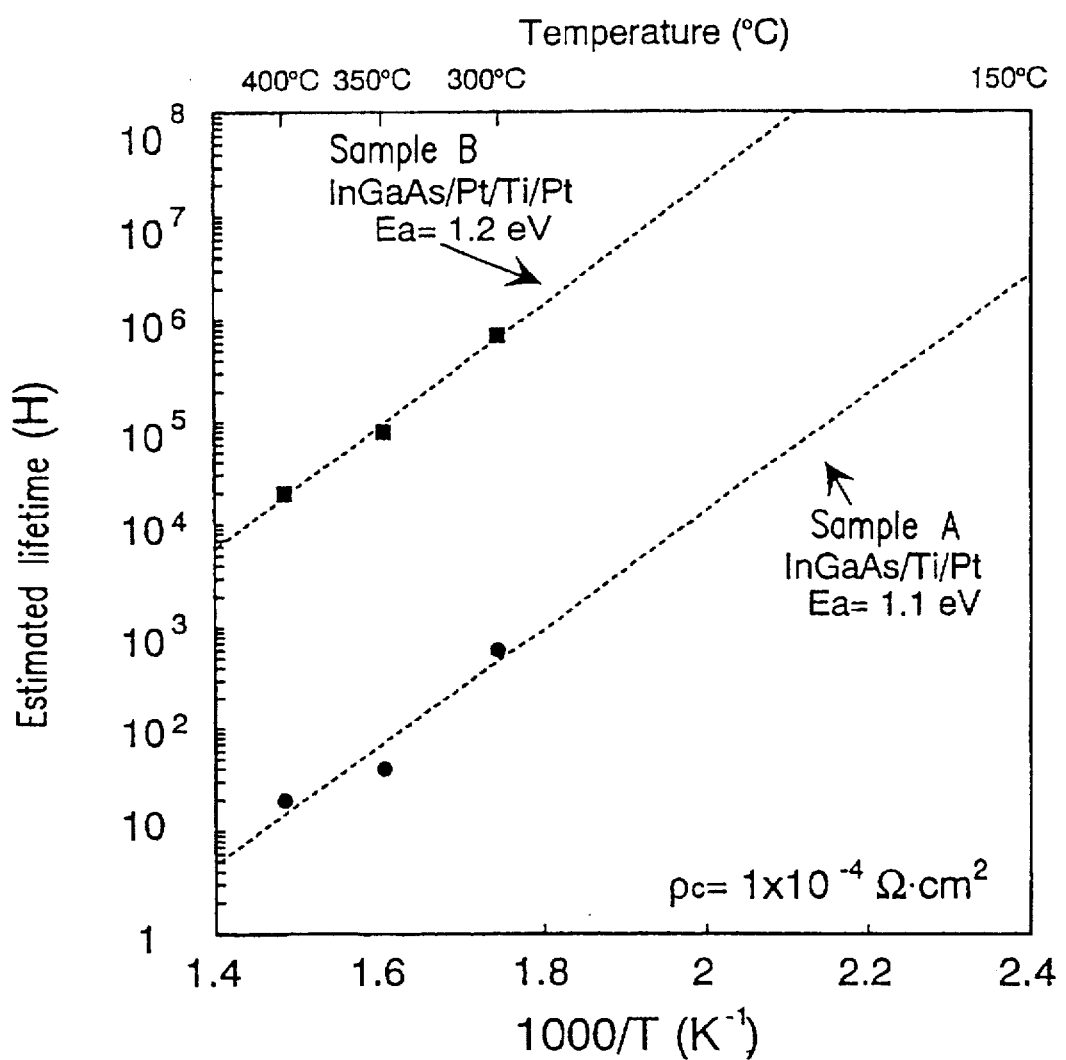
FIG. 16 is a graph illustrating the relationship between the temperature and the estimated lifetime of the contact electrode layer assumed from the contact resistivity.

As the result of the comparison, as shown in FIG. 16, sample B exhibits about a three orders of magnitude longer lifetime than sample A. Accordingly, it is confirmed that the Pt/Ti/Pt contact electrode layer of this example can maintain an excellent reliability for a longer period of time than the conventional structure.

In the semiconductor laser 100 of this example, the current blocking layers 107 and 108 are grown by a liquid-phase epitaxial growth method. However, the same effect can be obtained by employing a vapor-phase epitaxial growth method.

Moreover, although InP is used as the material for the current blocking layers 107 and 108 in this example, it is not limited thereto. The same effect can be obtained when, for example, the current blocking layers 107 and 108 are formed by using an InGaAsP layer having a composition capable of generating an energy gap larger than that generated by InGaAsP constituting the active layer. Alternatively, the current blocking layers can be formed by using a semi-insulating InP layer, resulting in the same effect.

(EXAMPLE 2)

The semiconductor laser 100 of Example 1 has a structure in which a p-type electrode is formed on the entire surface of the buried-type structure. A semiconductor laser 200 of Example 2 as a semiconductor light emitting element has a structure in which a leakage current is prevented so that the efficiency of the current injection into an active layer is further enhanced.

Figure 5A:
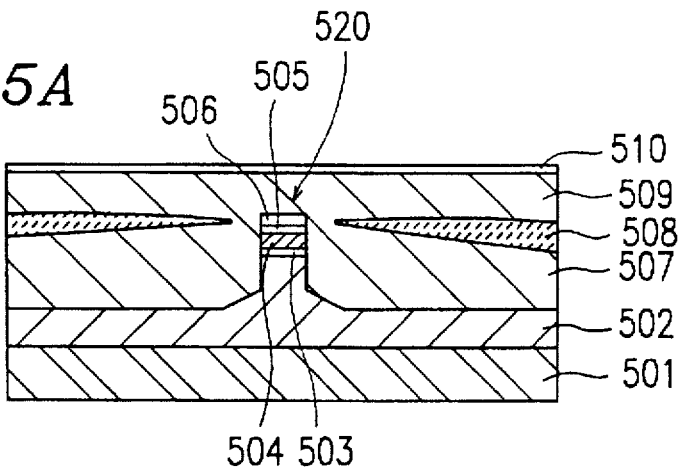
FIGS. 5A to 5C are cross-sectional views showing a structure of a semiconductor laser which is a semiconductor light emitting element according to Example 2 of the present invention, and the steps of fabricating the same.
Figure 5B:
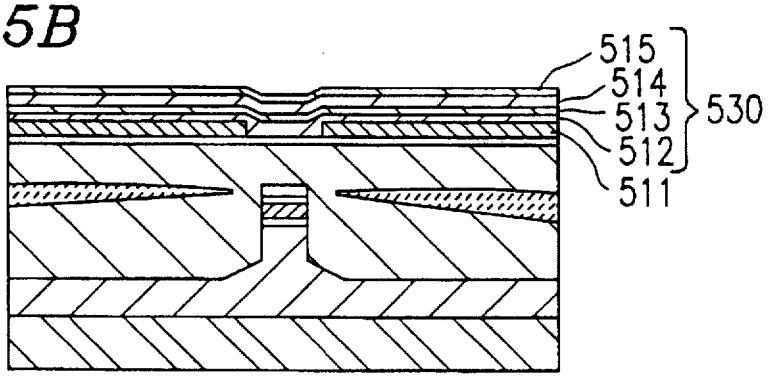
Figure 5C:
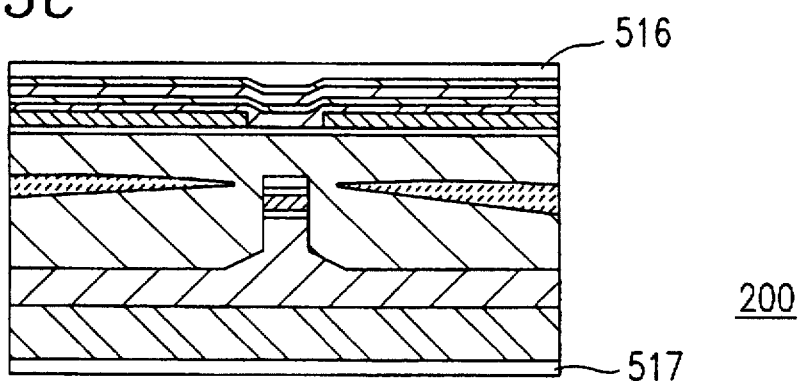

FIGS. 5A to 5C are cross-sectional views showing a semiconductor light emitting element of Example 2, specifically, showing a structure of a semiconductor laser 200 having a burying-type structure and the steps of fabricating the same.

The semiconductor laser 200 is fabricated in the following manner: first, as shown in FIG. 5A, an n-InP cladding layer 502 having a thickness of about 5 μm, an n-InGaAsP optical waveguide layer 503 having a thickness of about 500 nm, a multi-quantum well active layer 504 including 5 pairs of an InGaAsP well layer having a thickness of about 5 nm and an InGaAsP barrier layer having a thickness of about 10 nm, a p-InGaAsP optical waveguide layer 505 having a thickness of about 500 nm, and a p-InP cladding layer 506 having a thickness of about 0.5 μm, are sequentially grown on an n-InP substrate 501 by epitaxy, so as to form a semiconductor layered structure. Next, the thus-obtained structure is subjected to photolithography and etching so as to form a mesa-stripe 520 having a width of about 2 μm. After that, at the regions on both sides of the mesa-stripe 520, a p-InP current blocking layer 507 and an n-InP current blocking layer 508 are grown by a liquid-phase epitaxial growth method. Furthermore, on the mesa-stripe 520, the p-type current blocking layer 507 and the n-type current blocking layer 508, a p-InP burying layer 509 and a p-InGaAs contact layer 510 are sequentially grown. As a result, a buried-type hetero structure is formed.

Next as shown in FIG. 5B, a silicon oxide ($SiO_2$) film 511 having a thickness of about 0.15 μm is deposited on the entire surface of the p-type contact layer 510. Furthermore, a groove for forming an electrode is provided to a portion of the silicon oxide film 511 directly above the mesa-stripe 520 by using a resist film with a predetermined pattern. After that, an Ni layer 512, a Pt layer 513, a Ti layer 514, and a Pt layer 515 are sequentially deposited so as to form a metallic multilayered film. After that, the thus-obtained metallic multilayered film is subjected to annealing, so that a contact electrode layer 530 contained in a p-type electrode is formed.

Then, as shown in FIG. 5C, a metallic multilayered film 516 including a Ti layer and an Au layer is deposited onto the entire surface of the Pt layer 515, which is the top layer of the contact electrode layer 530. Finally, an n-type electrode 517 including an Au layer, an Sn layer, a Cr layer, a Pt layer, and Au layer is formed on the backside of the n-InP substrate 501. In this manner, a semiconductor laser 200 is completed.

In operation, the semiconductor laser 200 fabricated in the above-mentioned process is attached to a heat sink via a soldering material in a junction-down direction, in order to enhance the heat radiation characteristics thereof, as is the case of the semiconductor laser 100 of Example 1.

In the semiconductor laser 200 described above, the silicon oxide film 511 is provided between the p-InGaAs contact layer 510 and the contact electrode layer 530 including the Ni layer 512, the Pt layer 513, the Ti layer 514, and the Pt layer 515, in order to provide the current confinement for preventing the leakage current from flowing into the burying layer 509. The thus-obtained current confinement improves the efficiency of the current injection into the active layer 504, so that the operational characteristics of the semiconductor laser 200 are enhanced.

According to the results of the experiment conducted by the present inventors, when the contact layer including only the Pt layer 513, the Ti layer 514, and the Pt layer 515 formed on the silicon oxide film 511, the adhesiveness between the silicon oxide film 511 and the Pt layer 513 is not sufficient. This may cause the detachment of the contact electrode layer 530. For this reason, an Ni layer 512 which exhibits an excellent adhesiveness to the silicon oxide film 511 is provided between the silicon oxide film 511 and the Pt layer 513, so that the contact electrode layer 530 has an Ni/Pt/Ti/Pt structure. In this manner, the detachment of the contact electrode layer 530 can be prevented.

Figure 6:
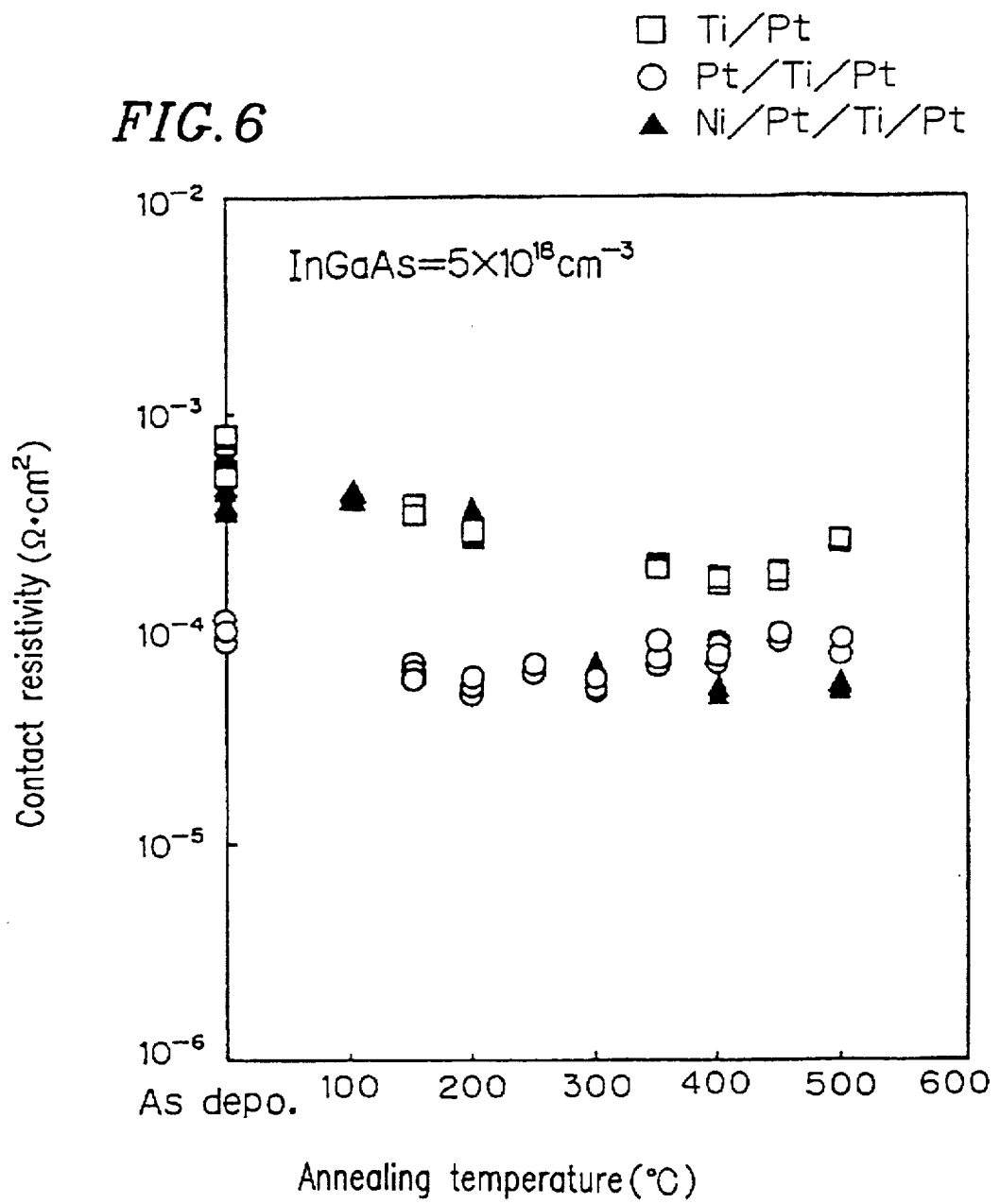
FIG. 6 is a graph illustrating an annealing temperature dependency of the contact resistivity according to Example 2 of the present invention.

FIG. 6 is a graph illustrating the relationship between a contact resistivity of a contact electrode layer and an annealing temperature for forming the contact electrode layer according to an experiment conducted by the present inventors by using a p-InGaAs contact layer having a doping concentration of about $5 \times 10^{18} cm^{-3}$. The graph of FIG. 6 indicates the data of three kinds of structures of the contact electrode layers including a conventional Ti/Pt structure, the Pt/Ti/Pt structure described in Example 1, and the Ni/Pt/Ti/Pt structure described in Example 2.

At the annealing temperature in the range between about 300° C. and about 500° C., the Ni/Pt/Ti/Pt contact electrode layer of Example 2 exhibits a contact resistivity substantially equal to that of the Pt/Ti/Pt contact electrode layer of Example 1. Therefore, as far as the contact electrode layer is annealed at the annealing temperature in the range between about 300° C. and about 500° C., the operational characteristics of the semiconductor laser are not adversely affected even if the contact electrode layer has the Ni/Pt/Ti/Pt structure.

In the semiconductor laser 200 of this example, the current blocking layers 507 and 508 are grown by a liquid-phase epitaxial growth method. Alternatively, the same effect can be obtained by employing a vapor-phase epitaxial growth method.

Moreover, although InP is used as the material for the current blocking layers 507 and 508 in this example, it is not limited thereto. The same effect can be obtained when for example, the current blocking layers 507 and 508 are formed by using an InGaAsP layer having a composition capable of generating an energy gap larger than that generated by InGaAsP constituting the active layer. Alternatively, the current blocking layers can be formed by using a semi-insulating InP layer, resulting in the same effect.

In Example 2, the silicon oxide film 511 as an insulating film is provided at the portions other than the portion directly above the mesa-stripe 520. Alternatively, as long as the insulation is ensured, the same effect can be attained by using an insulating film made of other materials such as silicon nitride (SiN) film.

(EXAMPLE 3)

A semiconductor laser 300 according to Example 3 of the present invention has a double-channel structure. The double-channel structure is used for improving the operational characteristics of lasers used for optical communication lasers with respect to high frequencies. In the double-channel structure, a p-n-p current blocking layer is removed from predetermined regions on both sides of the active layer by etching, thus reducing the junction capacitance and thereby improving the operational characteristics with respect to the high frequencies. As a result, this structure is particularly applied in a semiconductor laser used for optical communications.

FIGS. 7A to 7D are cross-sectional views showing a semiconductor light emitting element of Example 3, specifically, showing a structure of a semiconductor laser 300 having a double-channel structure and the steps of fabricating the same.

Figure 7A:
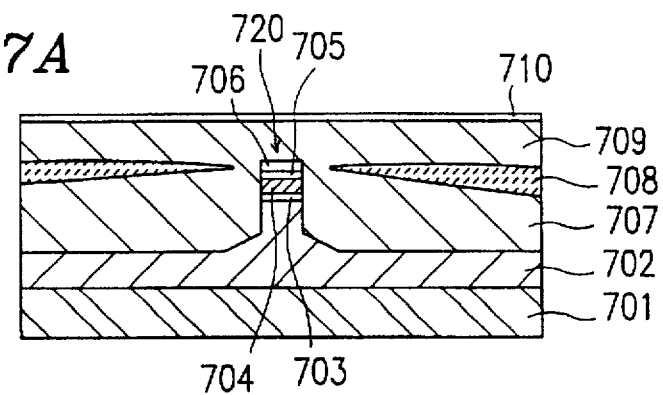
FIGS. 7A to 7D are cross-sectional views showing a structure of a semiconductor laser which is a semiconductor light emitting element according to Example 3 of the present invention, and the steps of fabricating the same.

The semiconductor laser 300 is fabricated in the following manner: first, as shown in FIG. 7A, an n-InP cladding layer 702 having a thickness of about 5 μm, an n-InGaAsP optical waveguide layer 703 having a thickness of about 500 nm, a multi-quantum well active layer 704 including 5 pairs of an InGaAsP well layer having a thickness of about 5 nm and an InGaAsP barrier layer having a thickness of about 10 nm, a p-InGaAsP optical waveguide layer 705 having a thickness of about 500 nm, and a p-InP cladding layer 706 having a thickness of about 0.5 μm, are sequentially grown on an n-InP substrate 701 by epitaxy, so as to form a semiconductor layered structure. Next, the thus-obtained structure is subjected to photolithography and etching so as to form a mesa-stripe 720 having a width of about 2 μm. After that, at the regions on both sides of the mesa-stripe 720, a p-InP current blocking layer 707 and an n-InP current blocking layer 708 are grown by a liquid-phase epitaxial growth method. Furthermore, on the mesa-stripe 720, the p-type current blocking layer 707 and the n-type current blocking layer 708, a p-InP burying layer 709 and a p-InGaAs contact layer 710 are sequentially grown. As a result, a buried-type hetero structure is formed.

Figure 7B:
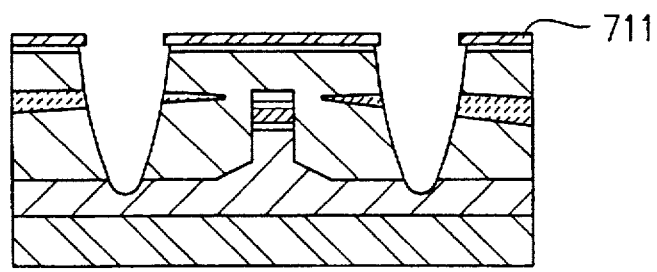

Next as shown in FIG. 7B, a silicon oxide ($SiO_2$) film 711 having a predetermined pattern is formed on the p-InGaAs contact layer 710. Next, grooves reaching the n-InP cladding layer 702 are formed on both sides of the mesa-stripe 720 by hydrochloric acid type etchant using the silicon oxide film 711 as a mask. In this manner, the parasitic capacitance produced in the current blocking layers 707 and 708 is reduced, so that the frequency response characteristics, particularly in the high frequency band, are enhanced.

Figure 7C:
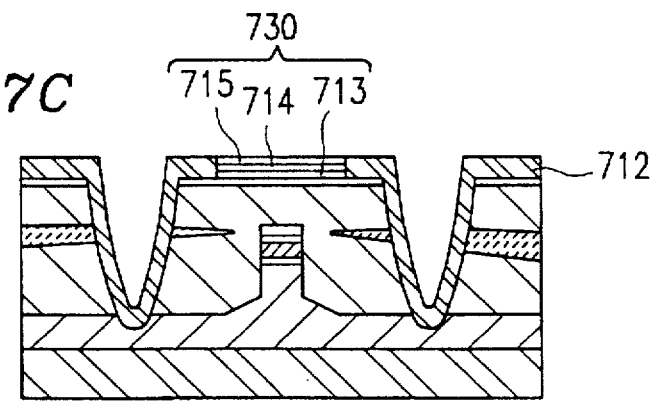

Next, as shown in FIG. 7C, the silicon oxide film 711 which has been used as a mask is removed, and then, another silicon oxide ($SiO_2$) film 712 having a thickness of about 0.15 μm is deposited on the entire surface of the structure formed in the above-mentioned steps, including the surfaces of the grooves. Then, a groove for forming an electrode is provided to a portion of the silicon oxide film 712 directly above the mesa-stripe 720 by using a resist having a predetermined pattern. After that, a Pt layer 713, a Ti layer 714, and a Pt layer 715 are sequentially deposited so as to form a metallic multilayered film. The thus-obtained metallic multilayered film is then subjected to lift-off and annealing, so that a contact electrode layer 730 included in a p-type electrode is formed.

Figure 7D:
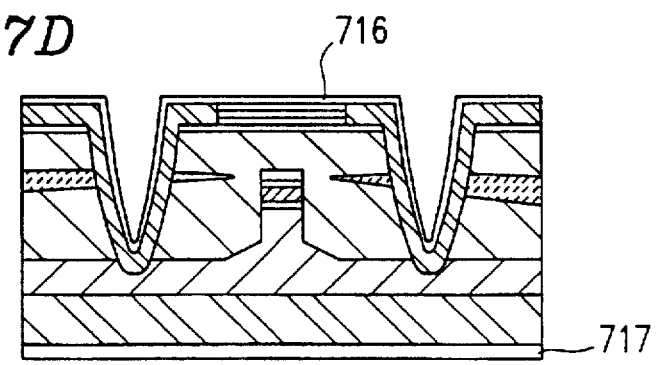

Then, as shown in FIG. 7D, a metallic multilayered film 716 including a Ti layer and an Au layer is deposited onto the entire surface of the Pt layer 715, which is the top layer of the contact electrode layer 730. Finally, an n-type electrode 717 including an Au layer, an Sn layer, a Cr layer, a Pt layer, and Au layer is formed on the backside of the n-InP substrate 701. In this manner, a semiconductor laser 300 is completed.

In operation, the semiconductor laser 300 fabricated in the above-mentioned process is attached to a heat sink via a soldering material in a junction-down direction, in order to enhance the heat radiation characteristics thereof, as is the case of the semiconductor 100 of Example 1.

As described above, in the formation of the contact electrode layer 730 included in the p-type electrode, the Pt layer 713, the Ti layer 714, and the Pt layer 715 are sequentially deposited so as to form a metallic multilayered film, and then, the thus-obtained film is subjected to lift-off. After that, the contact electrode layer 730 is formed only on the portion of the p-InGaAs contact layer 710 directly above the quantum well active layer 704. Alternatively, as described in Example 2, after the insulating film such as a silicon oxide film is deposited, a groove for forming an electrode is provided to a portion directly above the quantum well active layer 704 and the thus-obtained structure is subjected to deposition and annealing so as to form the contact electrode layer. In this case, the current confinement is achieved by the insulating film.

As described above, in the semiconductor laser 300 in Example 3, as is the case of the semiconductor laser 100 of Example 1, use of the Pt/Ti/Pt contact electrode layer 730 makes it possible to reduce the energy barrier formed at the interface between the p-type contact layer 710 and the contact electrode layer 730. As a result, it becomes easier to obtain an ohmic contact as compared with the case of using the conventional Ti/Pt contact electrode layer. Accordingly, a low-resistance ohmic contact can be obtained between the p-type contact layer and the contact electrode layer of the p-type electrode without increasing the doping concentration of the p-type contact layer. As a result, it is possible to decrease the voltage for driving the semiconductor laser, thereby decreasing the power consumption. Moreover, upon decreasing the contact resistance, a lower doping concentration of the p-type contact layer is achieved as compared with the case of using the conventional Ti/Pt contact electrode layer. This makes it possible to prevent the dopant inside the contact layer from diffusing into the active layer, thereby enhancing the reliability of the semiconductor laser.

In the semiconductor laser 300 of this example, the current blocking layers 707 and 708 are grown by a liquid-phase epitaxial growth method. Alternatively, the same effect can be obtained by employing a vapor-phase epitaxial growth method.

Moreover, although InP is used as the material for the current blocking layers 707 and 708 in this example, it is not limited thereto. The same effect can be obtained when, for example, the current blocking layers 707 and 708 are formed by using an InGaAsP layer having a composition capable of generating an energy gap larger than that generated by InGaAsP constituting the active layer. Alternatively, the current blocking layers can be formed by using a semi-insulating InP layer, resulting in the same effect.

In Example 3, the silicon oxide film 712 as an insulating film is provided at the portions other than the portion directly above the mesa-stripe 720. Alternatively, as long as the insulation is ensured, the same effect can be attained by using an insulating film made of other materials such as silicon nitride (SiN) film.

(EXAMPLE 4)

Figure 8A:
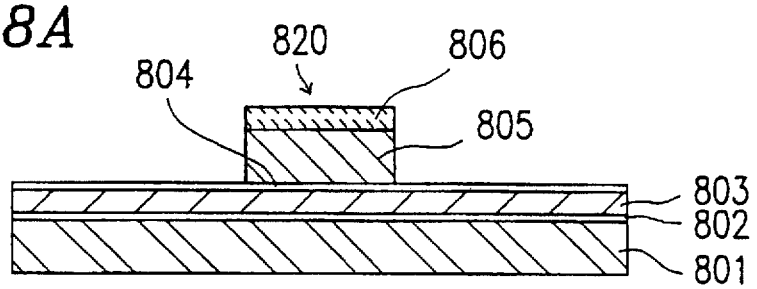
FIGS. 8A to 8C are cross-sectional views showing a structure of a semiconductor light emitting element according to Example 4 of the present invention, and the steps of fabricating the same.
Figure 8B:
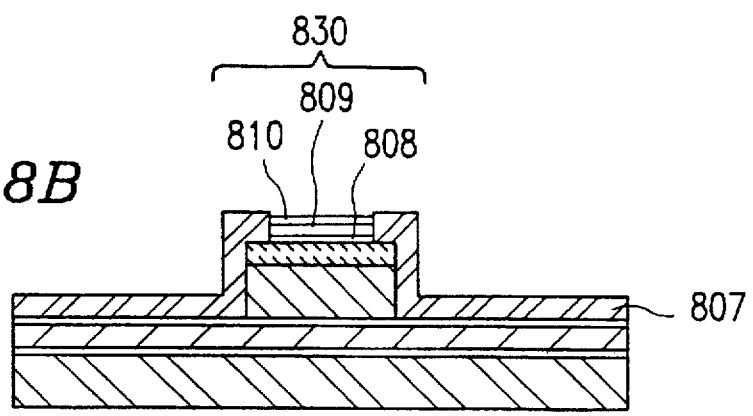
Figure 8C:
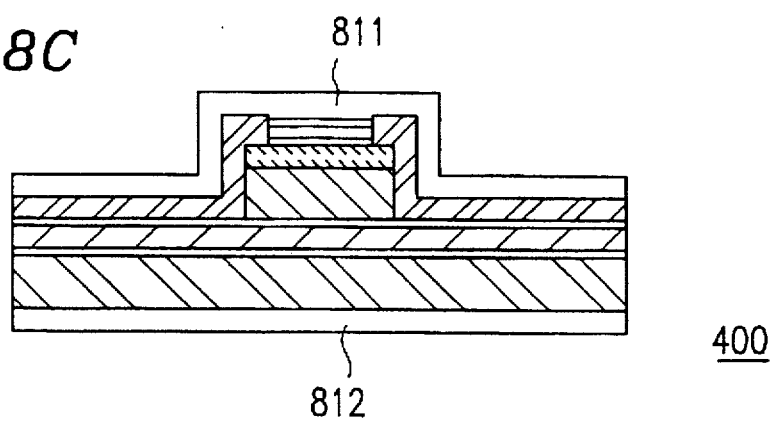
Figure 9A:
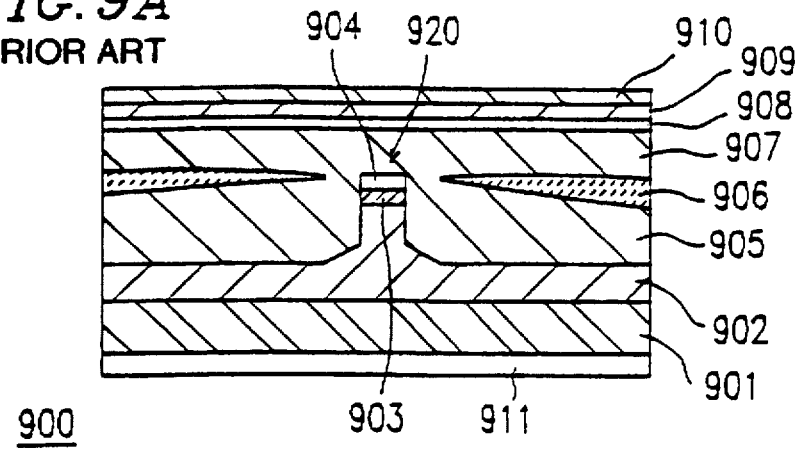
FIGS. 9A and 9B are cross-sectional views showing a structure of a conventional semiconductor laser, and the steps of fabricating the same.
Figure 9B:
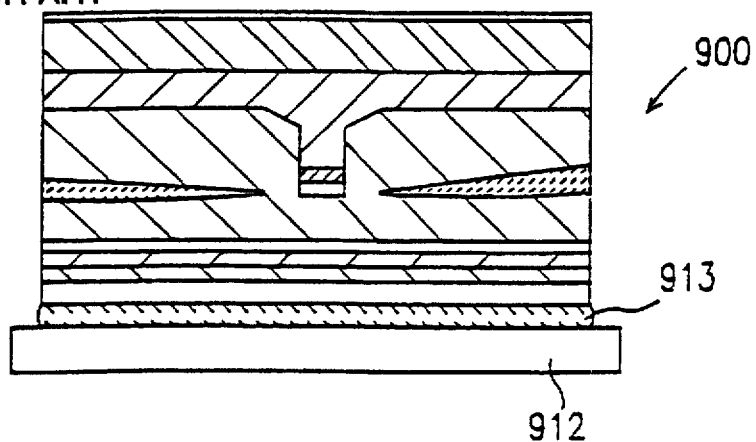

FIGS. 8A to 8C are cross-sectional views showing a structure of a semiconductor light emitting element 400 of Example 4 of the present invention and the steps of fabricating the same. The semiconductor light emitting element 400 has a ridge-shaped waveguide structure applicable to not only semiconductor lasers but also optical modulators.

The semiconductor light emitting element 400 is fabricated in the following manner: first, as shown in FIG. 8A, an n-InGaAsP optical waveguide layer 802 having a thickness of about 500 nm, a multi-quantum well active layer 803 including 5 pairs of an InGaAsP well layer having a thickness of about 5 nm and an InGaAsP barrier layer having a thickness of about 10 nm, a p-InGaAsP optical waveguide layer 804 having a thickness of about 500 nm, a p-InP cladding layer 805 having a thickness of about 1 µm, and a p-InGaAs contact layer 806, are sequentially grown by epitaxy on an n-InP substrate 801, so as to form a semiconductor layered structure. Next, the thus-obtained structure is subjected to photolithography and etching so as to selectively remove the p-InGaAs contact layer 806 and the p-InP cladding layer 805. As a result, a mesa-stripe 820 having a width of about 5 µm is formed.

Next, as shown in FIG. 8B, a silicon oxide ($SiO_2$) film 807 having a thickness of about 0.15 µm is deposited on the entire surface of the mesa-stripe 820 and the p-InGaAs optical waveguide layer 804. Furthermore, a groove for forming an electrode is provided to a predetermined portion of the silicon oxide film 807 on the mesa-stripe 820 by using a resist film having a predetermined pattern. After that, a Pt layer 808, a Ti layer 809, and a Pt layer 810 are sequentially deposited so as to form a metallic multilayered film. The thus-obtained metallic multilayered film is then subjected to lift-off and annealing, so that a contact electrode layer 830 included in a p-type electrode is formed. In this case, as far as a sufficient insulation can be obtained, the silicon oxide film 807 may be substituted with a film made of other insulating material such as polyimide.

Then, as shown in FIG. 8C, a metallic multilayered film 811 including a Ti layer and an Au layer is deposited onto the entire surface of the structure obtained in the above steps. Finally, an n-type electrode 812 including an Au layer, an Sn layer, a Cr layer, a Pt layer, and Au layer is formed on the backside of the n-InP substrate 801. In this manner, a semiconductor laser 400 is completed.

In the semiconductor light emitting element 400 having the above-described structure, as is the case of the semiconductor lasers 200 and 300 of Examples 2 and 3 respectively, the Pt/Ti/Pt contact electrode layer 830 is formed only above the P-InGaAs contact layer 806. On the other hand, on the silicon oxide film 807, the Ti/Au metallic multilayered film 811 with less stress is formed instead of the Pt/Ti/Pt contact electrode layer 830. In this manner, the ridge-shaped waveguide semiconductor light emitting element 400 having low resistance and high reliability can be fabricated.

(EXAMPLE 5)

Figure 10:
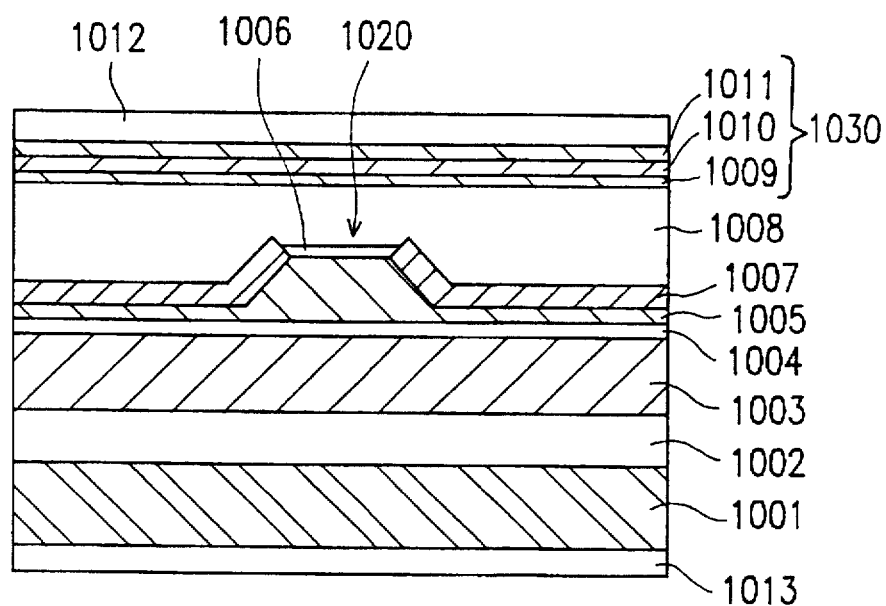
FIG. 10 is a cross-sectional view showing a structure of a semiconductor laser which is a semiconductor light emitting element according to Example 5 of the present invention, and the steps of fabricating the same.

FIG. 10 is a cross-sectional view showing a structure of a semiconductor light emitting element 500 and the steps of fabricating the same according to Example 5 of the present invention. Specifically, the semiconductor light emitting element 500 is a semiconductor laser which emits red color light having a wavelength of about 650 nm.

The semiconductor laser 500 is fabricated in the following manner: first, an n-GaAs buffer layer 1002, an n-AlGaInP cladding layer 1003, a GaInP active layer 1004, a p-AlGaInP cladding layer 1005, and a p-GaInP layer 1006 are sequentially grown on a GaAs substrate 1001 by epitaxy, so as to form a semiconductor layered structure. Next, the thus-obtained structure is subjected to photolithography and etching, so that the p-GaInP layer 1006 and the p-AlGaInP cladding layer 1005 are processed in the mesa shape. As a result, a stripe-shaped ridge 1020 is formed in the p-AlGaInP cladding layer 1005. Current blocking layers 1007 are formed on both sides of the stripe-shaped ridge 1020.

Thereafter, a Pt layer 1009, a Ti layer 1010, and a Pt layer 1011 are sequentially deposited onto the p-GaAs contact layer 1008 so as to form a metallic multilayered film. Then, the thus-obtained metallic multilayered film is subjected to annealing, so that a contact electrode layer 1030 included in the p-type electrode is formed. Furthermore, a metallic multilayered film 1012 including a Ti layer and an Au layer is deposited onto the entire surface of the Pt layer 1011 which is the top layer of the contact electrode layer 1030. Finally, an n-type electrode 1013 is formed on the backside of the n-GaAs substrate 1001. In this manner, a semiconductor laser 500 is completed.

Figure 11:
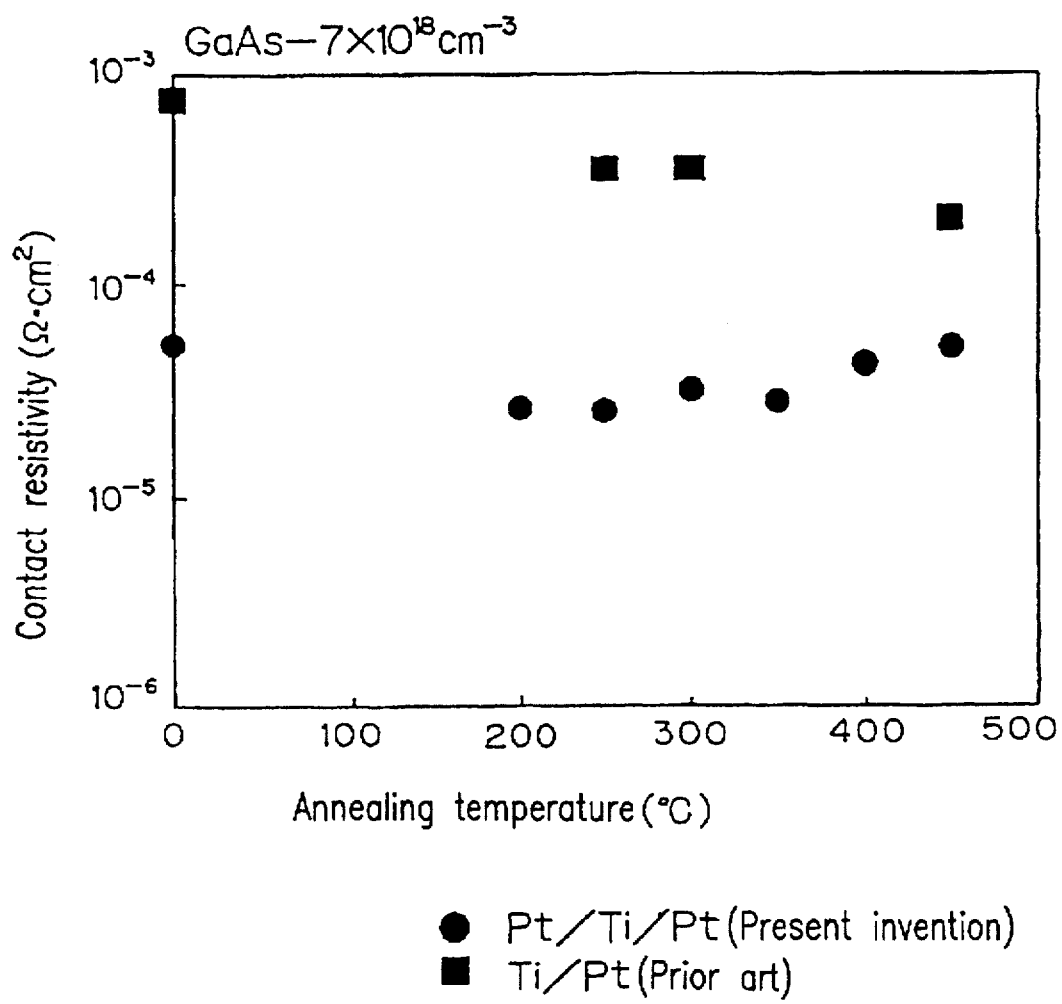
FIG. 11 is a graph illustrating an annealing temperature dependency of the contact resistivity according to Example 5 of the present invention.

FIG. 11 is a graph illustrating the relationship between a contact resistivity of a contact electrode layer and an annealing temperature for forming the contact electrode layer according to an experiment conducted by the present inventors, by using a p-GaAs contact layer having a doping concentration of about $7 \times 10^{18} cm^{-3}$.

As seen in FIG. 11, a conventional Ti/Pt contact electrode layer exhibits a contact resistivity in the range between about $1 \times 10^{-3}$ $\Omega \cdot cm^2$ and about $1 \times 10^{-4} \Omega \cdot cm^2$ at an annealing temperature of about 500° C. or less. In contrast, a Pt/Ti/Pt contact electrode layer used in the semiconductor laser 500 of the present example exhibits a contact resistivity in the range between about $1 \times 10^{-4} \Omega \cdot cm^2$ and $1 \times 10^{-5} \Omega \cdot cm^2$. This value is one order of magnitude smaller than that obtained from the conventional Ti/Pt contact electrode layer.

As described above, use of a Pt/Ti/Pt contact electrode layer 1030 for the semiconductor laser 500 makes it possible to reduce the contact resistivity as compared with the case of using the conventional Ti/Pt contact electrode layer. As a result, it is possible to decrease the voltage for driving the semiconductor laser, thereby decreasing the power consumption.

In Example 5, the p-type contact layer 1008 is a GaAs layer. Alternatively, the same effect can be obtained by forming the p-type contact layer 1008 with a GaInP layer.

(EXAMPLE 6)

Figure 12:
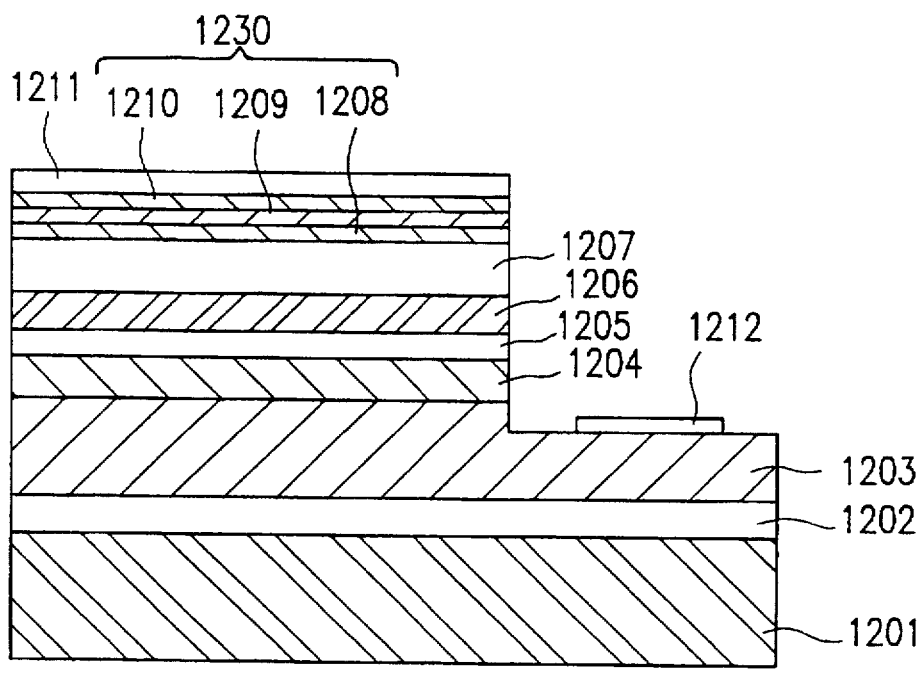
FIG. 12 is a cross-sectional view showing a structure of a semiconductor light emitting element according to Example 6 of the present invention, and the steps of fabricating the same.

FIG. 12 is a cross-sectional view showing a semiconductor light emitting element 600 according to Example 6 of the present invention. Specifically, the semiconductor light emitting element 600 is a gallium nitride type compound semiconductor light emitting element.

The semiconductor light emitting element 600 is fabricated in the following manner: first, an AlN buffer layer 1202, an n-GaN contact layer 1203, an n-$Al_{0.1}Ga_{0.9}N$ cladding layer 1204, an $In_{0.05}GaN$ active layer 1205, a p-$Al_{0.1}Ga_{0.9}N$ cladding layer 1206, and a p-GaN contact layer 1207 are sequentially grown on a sapphire substrate 1201 having a thickness of about 300 μm by epitaxy, so as to form a semiconductor layered structure. Next, the thus-obtained structure is subjected to photolithography, etching, and lift-off, so that a Pt layer 1208, a Ti layer 1209, and a Pt layer 1210 are sequentially deposited onto the p-GaN contact layer 1207, which is the top layer of the semiconductor layered structure, so as to form a metallic multilayered film. The thus-obtained metallic multilayered film is then subjected to annealing, so that a contact electrode layer 1230 included in the p-type electrode is formed. Furthermore, a metallic multilayered film 1211 including a Ti layer and an Au layer is deposited onto the entire surface of the Pt layer 1210, which is the top layer of the contact electrode layer 1230.

Next, predetermined portions of the layered structure formed in the above steps are removed by photolithography and etching, so that the n-GaN contact layer 1203 is exposed. On the surface of the exposed n-GaN contact layer 1203, an n-type electrode 1212 is deposited. Then, an annealing is performed thereto, resulting in the semiconductor light emitting element 600 being completed.

As described above, use of a Pt/Ti/Pt contact electrode layer 1230 for the semiconductor light emitting element 600 makes it possible to reduce the contact resistivity as compared with the case of using the conventional Ti/Pt contact electrode layer. As a result, it is possible to decrease the voltage for driving the semiconductor light emitting element, thereby decreasing the power consumption.

In Example 6, the contact layers 1203 and 1207 are GaN layers. Alternatively, the contact layers 1203 and 1207 may be $Al_xGa_yIn_zN$ layers ($x \geq 0$, $y \geq 0$, $z \geq 0$, $x+y+z=1$). Moreover, when the contact layers 1203 and 1207 are formed by III–V group compound semiconductor materials containing nitrogen as a V-group element in combination with the Pt/Ti/Pt contact electrode layer 1230, low contact resistance can be obtained.

(EXAMPLE 7)

FIGS. 13A to 13D are cross-sectional views showing a semiconductor light emitting element according to Example 7 of the present invention. Specifically, FIGS. 13A to 13D are cross-sectional views showing a structure of a semiconductor laser 700 having a burying-type structure, and the steps of fabricating the same.

Figure 13A:
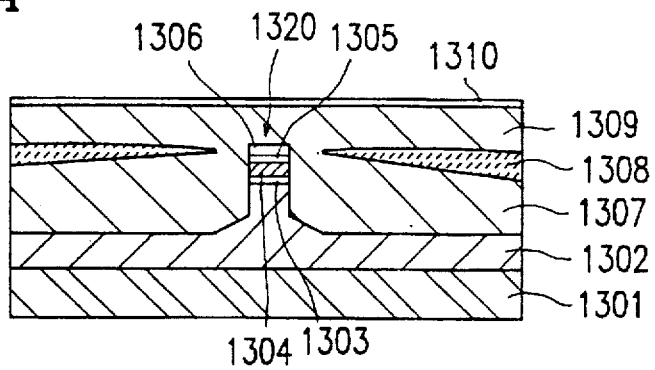
FIGS. 13A to 13D are cross-sectional views showing a structure of a semiconductor laser which is a semiconductor light emitting element according to Example 7 of the present invention, and the steps of fabricating the same.

The semiconductor laser 700 is fabricated in the following manner: first, as shown in FIG. 13A, an n-InP cladding layer 1302 having a thickness of about 5 μm, an n-InGaAsP optical waveguide layer 1303 having a thickness of about 500 nm, a multi-quantum well active layer 1304 including 5 pairs of an InGaAsP well layer having a thickness of about 5 nm and an InGaAsP barrier layer having a thickness of about 10 nm, a p-InGaAsP optical waveguide layer 1305 having a thickness of about 500 nm, and a p-InP cladding layer 1306 having a thickness of about 0.5 μm, are sequentially grown on an n-InP substrate 1301 by epitaxy, so as to form a semiconductor layered structure. Next, the thus-obtained structure is subjected to photolithography and etching so as to form a mesa-stripe 1320 having a width of about 2 μm. After that, at the regions on both sides of the mesa-stripe 1320, a p-InP current blocking layer 1307 and an n-InP current blocking layer 1308 are grown by a liquid-phase epitaxial growth method. Furthermore, on the mesa-stripe 1320, the p-type current blocking layer 1307 and the n-type current blocking layer 1308, a p-InP burying layer 1309 and a p-InGaAs contact layer 1310 having a thickness of about 0.2 μm are sequentially grown. As a result, a buried-type hetero structure is formed.

Figure 13B:
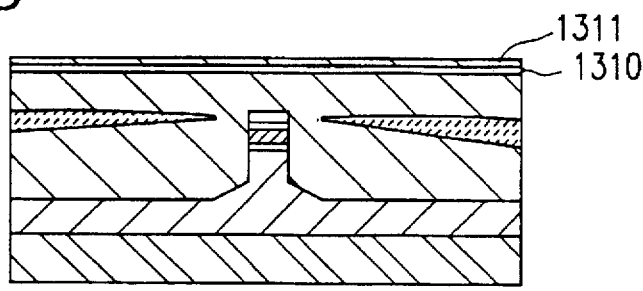

Next, as shown in FIG. 13B, on the p-InGaAs contact layer 1310, a Pt layer 1311 is deposited. After that, annealing is performed thereto, so that a contact electrode layer 1311 included in a p-type electrode is formed.

Figure 13C:
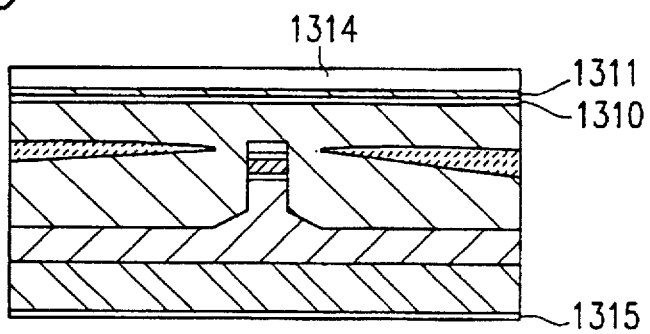

Then, as shown in FIG. 13C, a metallic multi-layered film 1314 including a Ti layer, a Pt layer, and an Au layer is deposited onto the entire surface of the Pt contact layer 1311. Finally, an n-type electrode 1315 including an Au layer, an Sn layer, a Cr layer, a Pt layer, and Au layer is formed on the backside of the n-InP substrate 1301. In this manner, a semiconductor laser 700 is completed.

Figure 13D:
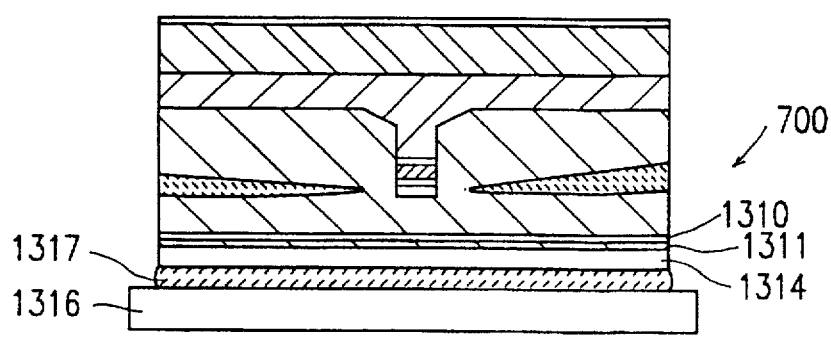

In operation, the semiconductor laser 700 fabricated in the above-mentioned process is attached to a heat sink 1316 via a soldering material 1317 in a junction-down direction, in order to enhance the heat radiation characteristics thereof, as shown in FIG. 13D.

In the semiconductor laser 700 having the above-described structure, the doping concentration of the P-InGaAs contact layer 1310 is typically about $8 \times 10^{18} cm^{-3}$. If a semiconductor laser-includes a contact layer having a doping concentration of larger than about $1\times10^{19}cm^{-3}$, there is a fear that long-term reliability may be adversely affected due to the problem of carrier diffusion, and the like. On the other hand, if a semiconductor laser includes a contact layer having a doping concentration of less than about $5\times10^{18}cm^{-3}$, it becomes difficult to obtain an ohmic contact having sufficiently low contact resistance. Accordingly, it is preferable that the p-InGaAs contact layer 1310 has a doping concentration in the range between about $5\times10^{18}cm^{-3}$ and about $1\times10^{19}cm^{-3}$.

Figure 14:
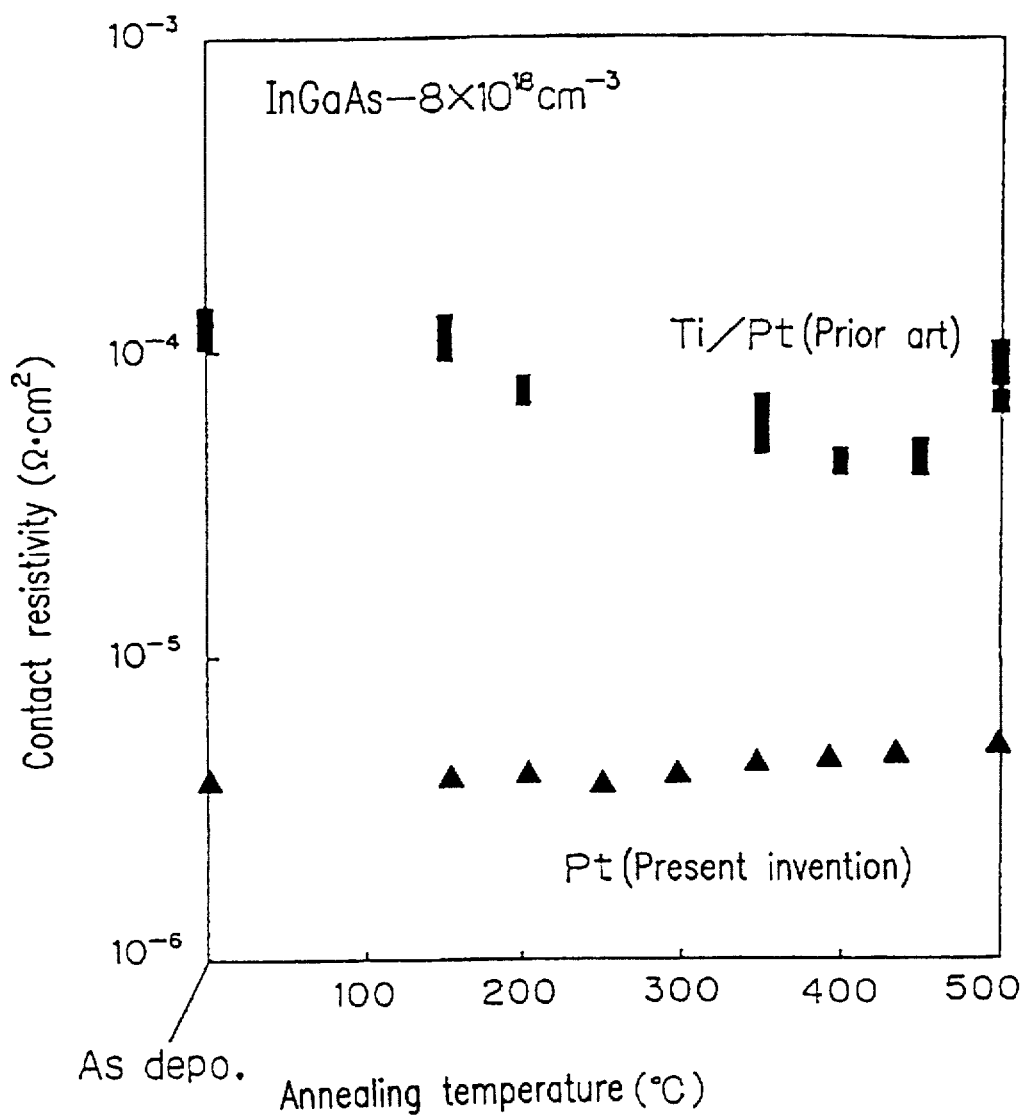
FIG. 14 is a graph illustrating an annealing temperature dependency of the contact resistivity according to Example 7 of the present invention.

FIG. 14 is a graph illustrating the relationship between a contact resistivity of a contact electrode layer and an annealing temperature for forming the contact electrode layer according to an experiment conducted by the present inventors, by using a p-InGaAs contact layer having a doping concentration of about $8\times10^{18}cm^{-3}$.

As seen in FIG. 14, a conventional Ti/Pt contact electrode layer exhibits a contact resistivity of about $1\times10^{-4}$ $\Omega\cdot cm^{2}$ at an annealing temperature of about 500° C. or less. In contrast, a Pt contact electrode layer used in the semiconductor laser 700 of the present example exhibits a contact resistivity of about $1\times10^{-5}\Omega\cdot cm^{2}$ or less. This value is one order of magnitude smaller than that obtained from the conventional Ti/Pt contact electrode layer.

Figure 15:
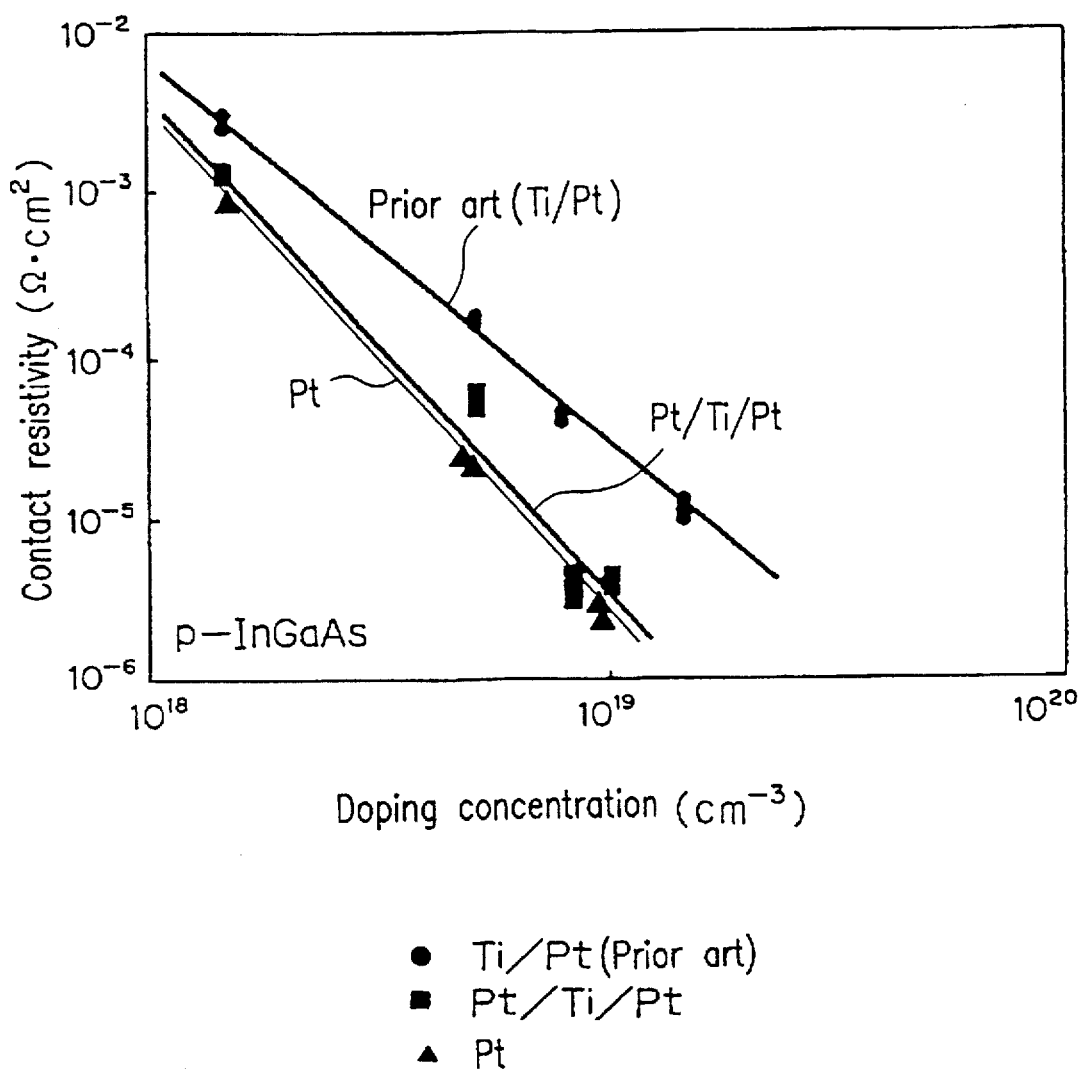
FIG. 15 is a graph illustrating a doping concentration dependency of the contact resistivity according to Example 7 of the present invention.

FIG. 15 is a graph illustrating the relationship between the contact resistivity of the contact electrode layer and a doping concentration of a p-InGaAs contact layer, according to the experiment conducted by the present inventors.

It is preferable that the contact resistivity of the semiconductor laser is about $1\times10^{-5}$ $\Omega\cdot cm^{2}$ or less. In this case, when a conventional Ti/Pt contact electrode layer is used, the p-InGaAs contact layer has the doping concentration of about $1\times10^{19}cm^{-3}$ or more. In contrast, when the Pt contact electrode is used for the semiconductor laser 700, in order to obtain the above-mentioned contact resistivity, it is sufficient that the p-InGaAs contact layer has a doping concentration of about $7\times10^{18}cm^{-3}$. FIG. 15 also shows the data of the Pt/Ti/Pt contact electrode layer described in Example 1. It is observed that substantially the same data values can be obtained from the Pt contact layer of Example 7 as that obtained from the Pt/Ti/Pt contact layer.

Consequently, it is confirmed that the Pt contact electrode layer used in the semiconductor laser 700 of this example is sufficiently useful as a part of a p-type non-alloy electrode of the semiconductor laser.

As described above, when the contact electrode layer in the p-type electrode includes at least one Pt layer which is brought into contact with the p-type contact layer, it is possible to obtain the same effect as that obtained from the contact layer having a Pt/Ti/Pt layered structure described in Examples 1 to 6. Although Example 7 has been described taking as an example the semiconductor laser 700 which has the structure corresponding to that of the semiconductor laser 100 of Example 1, the Pt contact electrode layer of Example 7 is also applicable to the semiconductor lasers or the semiconductor light emitting elements 200 to 600 of Examples 2 to 6.

Alternatively, the same effect can be obtained by using a contact electrode layer having a Pt/Ti structure in which a Ti layer is deposited on a Pt layer.

In Examples 1 to 7, InGaAs is mainly used as the material for the p-type contact layer. Alternatively, a p-type contact layer can be formed by using InGaAsP, which is a quartenary-type compound semiconductor material. In particular, taking the junction between the p-type contact layer and the cladding layer into consideration, it is preferable to use a p-InGaAsP contact layer.

Upon comparing the p-InGaAs contact layer with the p-InGaAsP contact layer, the energy barrier formed at the junction interface between the contact electrode layer included in the p-type electrode and the p-type contact layer is smaller in the case of using p-InGaAs. However, the energy barrier formed at the junction interface between the p-type cladding layer and the p-type contact layer is smaller in the case of using p-InGaAsP. Accordingly, by using InGaAsP, which is a quartenary-type compound semiconductor material, as the material for the p-type contact layer, and properly adjusting the composition thereof, both the energy barrier formed at the interface between the contact electrode layer and the p-type contact layer, and the energy barrier formed at the interface between the p-type contact layer and the p-type cladding layer are reduced, thereby allowing the holes, which are carriers, to move more easily.

As described above, according to the present invention, the semiconductor light emitting element such as a semiconductor laser includes a contact electrode layer having a layered structure in which at least a Pt layer is included. The contact electrode layer is included in the p-type electrode and forms an ohmic contact with a p-type contact layer. The contact electrode layer is formed by sequentially depositing, for example, a Pt layer, a Ti layer, and another Pt layer on a p-InGaAs contact layer. In this manner, the resistance of the p-type contact layer can be decreased so that the voltage for driving the semiconductor light emitting element is decreased. Accordingly, low power consumption can be attained. Moreover, due to the low contact resistance, even when a high bias driving current is applied, an amount of heat caused by the Joule heat is small. For this reason, a high output power semiconductor light emitting element with small saturation of light output can be realized.

Moreover, the contact resistance can be decreased, while the doping concentration of the p-type contact layer is further decreased as compared with the case of using a conventional Ti/Pt contact electrode layer. As a result, the diffusion of the dopant from the inside of the contact layer into the active layer is suppressed, thereby enhancing the reliability of the semiconductor laser.

Even when the p-type contact layer is made of other materials such as GaAs and GaN, the same effect can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting element comprising:
    a layered structure including at least an n-type cladding layer, an active layer, and a p-type cladding layer;
    a p-type contact layer formed above the layered structure, the p-type contact layer being made of p-type InGaAs; and
    a p-type non-alloy electrode which includes a contact electrode layer formed on the p-type contact layer,
    wherein the contact electrode layer includes at least a Pt layer, and the doping concentration of the p-type contact layer is set within the range between about $5\times10^{18}cm^{-3}$ and about $1\times10^{19}cm^{-3}$, and
    the Pt layer is disposed so as to be in contact with the p-type contact layer.

2. A semiconductor light emitting element according to claim 1, further comprising:

a mesa-stripe formed on a substrate including the layered structure;

a current blocking layer formed on both sides of the mesa-stripe; and a p-type burying layer formed on the mesa-stripe and the current blocking layer so as to have a buried structure, wherein the p-type contact layer is formed on the p-type burying layer.

3. A semiconductor light emitting element according to claim 1, wherein the n-type cladding layer and the active layer included in the layered structure are formed on a substrate, and the p-type cladding layer and the p-type contact layer are included in a ridge formed on the active layer so as to form a ridge-shaped structure.

4. A semiconductor light emitting element according to claim 1, wherein the p-type contact layer has a thickness larger than a thickness of a depletion layer formed by a metal-semiconductor contact between the p-type contact electrode layer and the p-type contact layer.

5. A semiconductor light emitting element according to claim 1, wherein the contact electrode layer further comprises a Ti layer deposited on the Pt layer.

6. A semiconductor light emitting element according to claim 1, wherein the contact electrode layer further comprises a Ti layer deposited on the Pt layer and another Pt layer deposited on the Ti layer.

7. A semiconductor light emitting element according to claim 1, wherein the p-type cladding layer is a first AlGaInP cladding layer formed on the active layer into a stripe-shape, and the n-type cladding layer is a second AlGaInP cladding layer formed below the active layer, and the semiconductor light emitting element further comprises a current blocking layer formed on both sides of the stripe-shaped first cladding layer.

8. A semiconductor light emitting element, comprising:

a layered structure including at least an n-type cladding layer, an active layer, and a p-type cladding layer;

a p-type contact layer formed above the layered structure, the p-type contact layer being made of p-type InGaAs; and a p-type non-alloy electrode which includes a contact electrode layer formed on the p-type contact layer, wherein the contact electrode layer includes at least a Pt layer, and the doping concentration of the p-type contact layer is set within the range between about $5 \times 10^{18} cm^{-3}$ and about $1 \times 10^{19} cm^{-3}$, and the contact electrode layer further comprises a metallic layer made of a metal having an excellent adhesiveness to a semiconductor material and an insulating film.

9. A semiconductor light emitting element according to claim 8, wherein the metallic layer is an Ni layer.

\* \* \* \* \*